United States Patent
Igawa et al.

(10) Patent No.: US 11,908,682 B2
(45) Date of Patent: Feb. 20, 2024

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Hiroto Igawa, Toyama (JP); Masanori Nakayama, Toyama (JP); Katsunori Funaki, Toyama (JP); Tatsushi Ueda, Toyama (JP); Yasutoshi Tsubota, Toyama (JP); Eiko Takami, Toyama (JP); Yuichiro Takeshima, Toyama (JP); Yuki Yamakado, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 557 days.

(21) Appl. No.: 17/185,399

(22) Filed: Feb. 25, 2021

(65) Prior Publication Data
US 2021/0183645 A1  Jun. 17, 2021

Related U.S. Application Data

(63) Continuation of application No. PCT/JP2018/034040, filed on Sep. 13, 2018.

(51) Int. Cl.
*H01L 21/02* (2006.01)
*H01J 37/32* (2006.01)
(Continued)

(52) U.S. Cl.
CPC .......... *H01L 21/02164* (2013.01); *C23C 8/12* (2013.01); *C23C 8/36* (2013.01);
(Continued)

(58) Field of Classification Search
None
See application file for complete search history.

(56) References Cited

U.S. PATENT DOCUMENTS

| 4,510,172 A | 4/1985 | Ray |
| 2001/0035131 A1 | 11/2001 | Sakuma et al. |

(Continued)

FOREIGN PATENT DOCUMENTS

| JP | 60-257526 A | 12/1985 |
| JP | 07-263686 A | 10/1995 |

(Continued)

OTHER PUBLICATIONS

Office Action in corresponding Japanese Patent Application No. 2020-546637, dated Mar. 15, 2022, with English translation.

*Primary Examiner* — Feifei Yeung Lopez
(74) *Attorney, Agent, or Firm* — Edell, Shapiro & Finnan, LLC

(57) ABSTRACT

According to one aspect of the technique, there is provided a method of manufacturing a semiconductor device, including: (a) forming a first oxide layer by modifying a surface of a substrate at a first temperature with a plasma of a first oxygen-containing gas; and (b) forming a second oxide layer thicker than the first oxide layer by heating the substrate to a second temperature higher than the first temperature and modifying the surface of the substrate, on which the first oxide layer is formed, with a plasma of a second oxygen-containing gas.

20 Claims, 11 Drawing Sheets

(51) Int. Cl.
    *C23C 8/12*           (2006.01)
    *C23C 8/36*           (2006.01)

(52) U.S. Cl.
    CPC .. *H01J 37/32449* (2013.01); *H01J 37/32724* (2013.01); *H01L 21/02252* (2013.01); *H01L 21/02255* (2013.01); *H01J 2237/332* (2013.01)

(56) References Cited

U.S. PATENT DOCUMENTS

| | | | |
|---|---|---|---|
| 2005/0215066 A1* | 9/2005 | Joshi | H01L 21/02164 438/758 |
| 2009/0047778 A1 | 2/2009 | Sasaki | |
| 2010/0093185 A1 | 4/2010 | Kabe et al. | |
| 2010/0184267 A1 | 7/2010 | Kabe et al. | |

FOREIGN PATENT DOCUMENTS

| | | |
|---|---|---|
| JP | 2000-332009 A | 11/2000 |
| JP | 2000-332245 A | 11/2000 |
| JP | 2001-308084 A | 11/2001 |
| JP | 2008-091409 A | 4/2008 |
| JP | 2010-171128 A | 8/2010 |
| WO | 2007099922 A1 | 9/2007 |

* cited by examiner

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS REFERENCE TO RELATED APPLICATIONS

This application is a continuation of International Application No. PCT/JP2018/034040, filed on Sep. 13, 2018, the entire contents of which are hereby incorporated by reference.

TECHNICAL FIELD

The present disclosure relates to a method of manufacturing a semiconductor device, a substrate processing apparatus and a non-transitory computer-readable recording medium.

BACKGROUND

As an example of a manufacturing process of a semiconductor device, a process of oxidizing a surface of a substrate may be performed. For example, according to some related arts, a method of manufacturing a semiconductor device is disclosed. According to the method of manufacturing the semiconductor device described above, after forming a gate oxide film on a semiconductor substrate, a poly-silicon film and a metal silicide film of high melting point are sequentially deposited to pattern a gate electrode wiring, and the gate electrode wiring is exposed to an oxygen plasma to form an oxide film on an exposed surface of the gate electrode wiring. Further, according to other related arts, a method of forming a silicon oxide film is disclosed. According to the method of forming the silicon oxide film described above, silicon (that is, a silicon substrate) is processed by a plasma oxidation to form the silicon oxide film and then thermally oxidized.

For example, when a silicon film (also referred to as a "doped Si film") doped with impurities (dopants) on a surface of the silicon substrate is oxidized to form the silicon oxide film (also referred to as a "$SiO_2$ film"), the dopants in the doped Si film may be desorbed when the doped Si film is oxidized at a high temperature. As a result, surface characteristics of the doped Si film may change significantly. In addition, the dopants desorbed from the doped Si film may adhere to a surface of a heater to adversely affect the heat conduction to the substrate such as the silicon substrate, or may adhere to a lamp window to adversely affect the light transmission. As a result, a temperature of the substrate may decrease and a thickness of the film such as the $SiO_2$ film may decrease. Further, a stable operation of an apparatus such as a substrate processing apparatus may not be possible since a process chamber of the apparatus may be contaminated by the dopants desorbed from the doped Si film. On the other hand, when an oxidation process such as the plasma oxidation process is performed at a low temperature, it is possible to suppress the desorption of the dopants from the doped Si film. However, the throughput may decrease because a sufficient film quality may not be obtained.

SUMMARY

Described herein is a technique capable of forming an oxide layer while suppressing a decrease in the productivity and suppressing an unintended change in surface characteristics of a substrate.

According to one aspect of the technique of the present disclosure, there is provided a method of manufacturing a semiconductor device, including: (a) forming a first oxide layer by modifying a surface of a substrate at a first temperature with a plasma of a first oxygen-containing gas; and (b) forming a second oxide layer thicker than the first oxide layer by heating the substrate to a second temperature higher than the first temperature and modifying the surface of the substrate, on which the first oxide layer is formed, with a plasma of a second oxygen-containing gas.

DETAILED DESCRIPTION

Hereinafter, one or more embodiments (also simply referred to as "embodiments") according to the technique of the present disclosure will be described with reference to the drawings. In the present specification, the term "step" is not limited to an independent step, and it may be referred to as a step as long as the step is performed to achieve an intended purpose of the step even when the step cannot be clearly distinguished from other steps. In the present specification, a first oxidizing step and a second oxidizing step described later may be collectively or individually referred to as an "oxidizing step" and a first oxygen-containing gas and a second oxygen-containing gas described later may be collectively or individually referred to as an "oxygen-containing gas". In the present specification, a first oxide layer and a second oxide layer thicker than the first oxide layer may be collectively or individually referred to as an "oxide layer". In the present specification, the term "oxide layer" refers to an oxide layer formed by modifying a surface of a substrate rather than an oxide layer formed by depositing an oxide substance on the surface of the substrate. For example, when a film is already formed on the surface of the substrate, the term "oxide layer" refers to an oxide layer formed by modifying the surface of the film.

A method of manufacturing a semiconductor device according to the embodiments of the technique of the present disclosure may include: a first oxidizing step of forming a first oxide layer by modifying a surface of a substrate at a first temperature with a plasma of a first oxygen-containing gas; and a second oxidizing step of forming a second oxide layer thicker than the first oxide layer by heating the substrate to a second temperature higher than the first temperature and modifying the surface of the substrate, on which the first oxide layer formed, with a plasma of a second oxygen-containing gas.

By performing the first oxidizing step of forming the first oxide layer by modifying the surface of the substrate at the first temperature with the plasma of the first oxygen-containing gas and the second oxidizing step of forming the second oxide layer thicker than the first oxide layer by heating the substrate to the second temperature higher than the first temperature and modifying the surface of the substrate, on which the first oxide layer formed, with the plasma of the second oxygen-containing gas after the first oxidizing step, it is possible to suppress an unintended change in surface characteristics of the substrate while suppressing a decrease in the productivity.

Figure 1A:
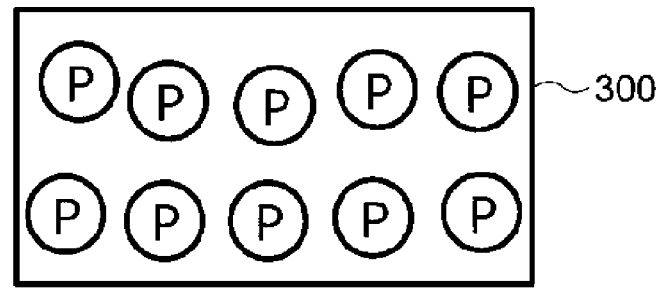
FIGS. 1A through 1C schematically illustrate a substrate including a film doped with phosphorus (P) on a surface thereof when a first oxidizing step of forming a first oxide layer by plasma-oxidizing the film and a second oxidizing step of forming a second oxide layer by plasma-oxidizing the first oxide layer are performed.
Figure 1B:
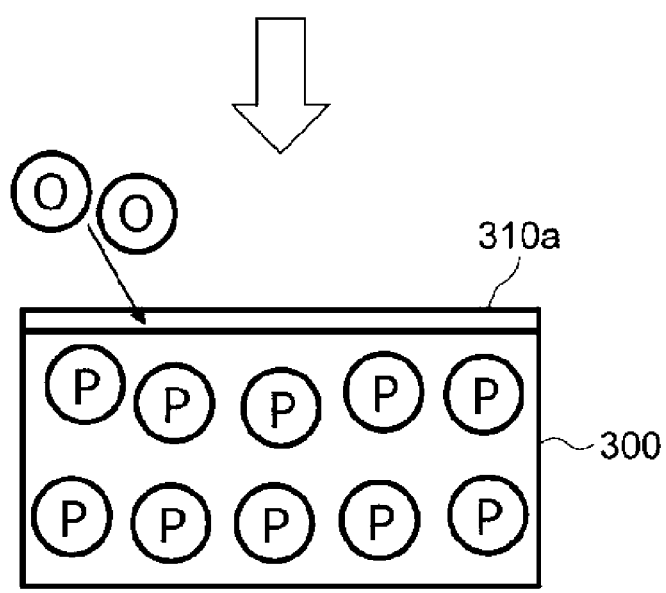
Figure 1C:
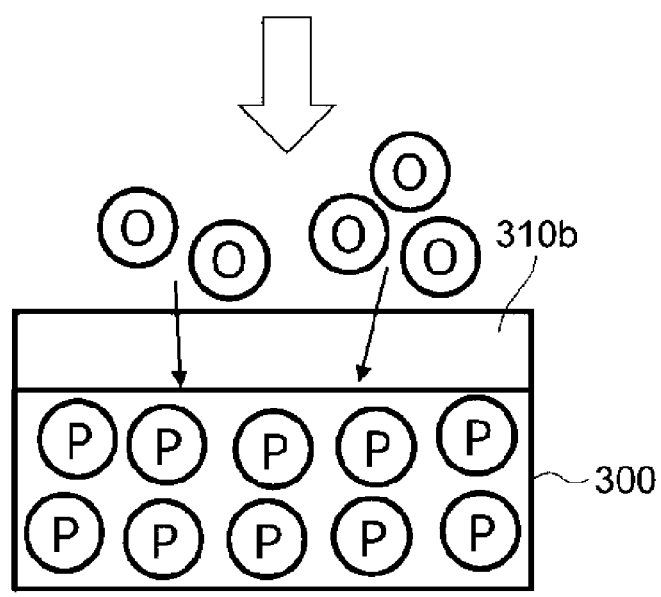

The substrate (that is, the substrate to be processed) used in the method of manufacturing the semiconductor device according to the embodiments can be appropriately selected according to the application of the semiconductor device to be manufactured. For example, the method of manufacturing the semiconductor device according to the embodiments can be suitably applied when a substrate including a film doped with impurities on a surface thereof is oxidized from a surface of the film to form an oxide film. FIGS. 1A through 1C schematically illustrate the substrate including a silicon (Si) film 300 doped with phosphorus (P) on the surface thereof when a first oxide layer 310*a* is formed and then a second oxide layer 310*b* thicker than the first oxide layer 310*a* is formed by the method of manufacturing the semiconductor device according to the embodiments. In the first oxidizing step, by performing a plasma oxidation at the first temperature which is a relatively low temperature by supplying the first oxygen-containing gas containing at least oxygen (O) to the substrate including the silicon film 300 doped with phosphorus (P) on the surface thereof, the silicon film 300 is oxidized from a surface of the silicon film 300 to form the first oxide layer 310*a* which is a silicon oxide layer mainly containing silicon oxide ($SiO_2$). In the first oxidizing step described above, it is possible to suppress the desorption (release) of the impurities (dopants) from the film such as the silicon film 300, and it is also possible to suppress the change in the characteristics of the film due to the desorption of the dopants. Further, it is possible to prevent a decrease in an oxidation rate and a decrease in a uniformity of the oxide layer on a surface thereof due to the contamination of a process chamber with the dopants.

After the first oxidizing step, the second oxidizing step is performed at the second temperature which is higher than the first temperature. The first oxide layer 310*a* formed on the surface of the silicon film 300 by performing the first oxidizing step serves as a cap layer of suppressing the desorption of the dopants from the silicon film 300. Therefore, in the second oxidizing step, by performing the plasma oxidation at the second temperature higher than the first temperature, it is possible to improve the oxidation rate and to suppress the desorption of the dopants. As a result, it is possible to improve the throughput and to suppress the deterioration of a film quality. Therefore, it is possible to form the second oxide layer 310*b* with desired characteristics. The second oxide layer 310*b* thicker than the first oxide layer 310*a* is a silicon oxide layer mainly containing $SiO_2$.

An apparatus for performing the method of manufacturing the semiconductor device according to the embodiments is not particularly limited as long as the first oxidizing step and the second oxidizing step described above can be performed. For example, the first oxidizing step and the second oxidizing step may be performed in separate process chambers. However, from the viewpoint of the productivity and the workability, it is preferable that the first oxidizing step and the second oxidizing step are performed in the same process chamber. By performing the first oxidizing step and the second oxidizing step in the same process chamber, it is possible to simplify or omit steps such as a substrate loading and unloading step and a pressure and temperature adjusting step of adjusting an inner pressure and an inner temperature of the process chamber in accordance with the substrate loading and unloading step. It is also possible to greatly improve the productivity and the workability.

Hereinafter, an example of a substrate processing apparatus capable of performing the method of manufacturing the semiconductor device according to the embodiments will be described. The substrate processing apparatus according to the embodiments may include: the process chamber in which the substrate is processed; a gas supplier configured to supply the oxygen-containing gas into the process chamber; a heater capable of heating the substrate arranged in the process chamber; a plasma generator configured to excite the oxygen-containing gas supplied into the process chamber to generate the plasma; and a controller capable of controlling the gas supplier, the heater and the plasma generator to perform: the first oxidizing step of forming the first oxide layer by modifying the surface of the substrate in the process chamber at the first temperature with a plasma of the first oxygen-containing gas; and the second oxidizing step of forming the second oxide layer thicker than the first oxide layer by heating the substrate to the second temperature higher than the first temperature and modifying the surface of the substrate, on which the first oxide layer formed, with a plasma of the second oxygen-containing gas.

First Embodiment

Figure 2:
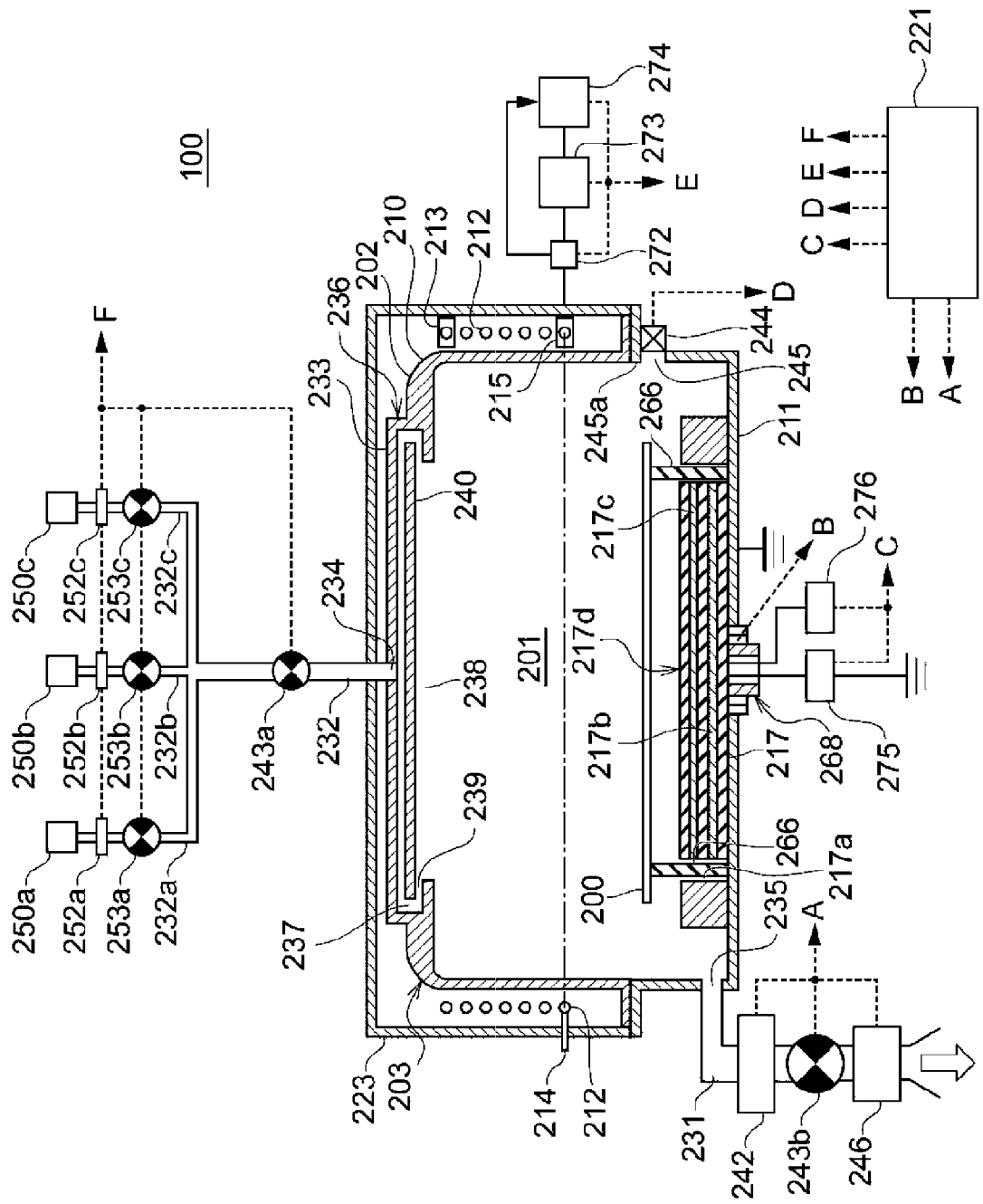
FIG. 2 schematically illustrates an exemplary configuration of a substrate processing apparatus according to a first embodiment described herein when the first oxidizing step is performed.
Figure 3:
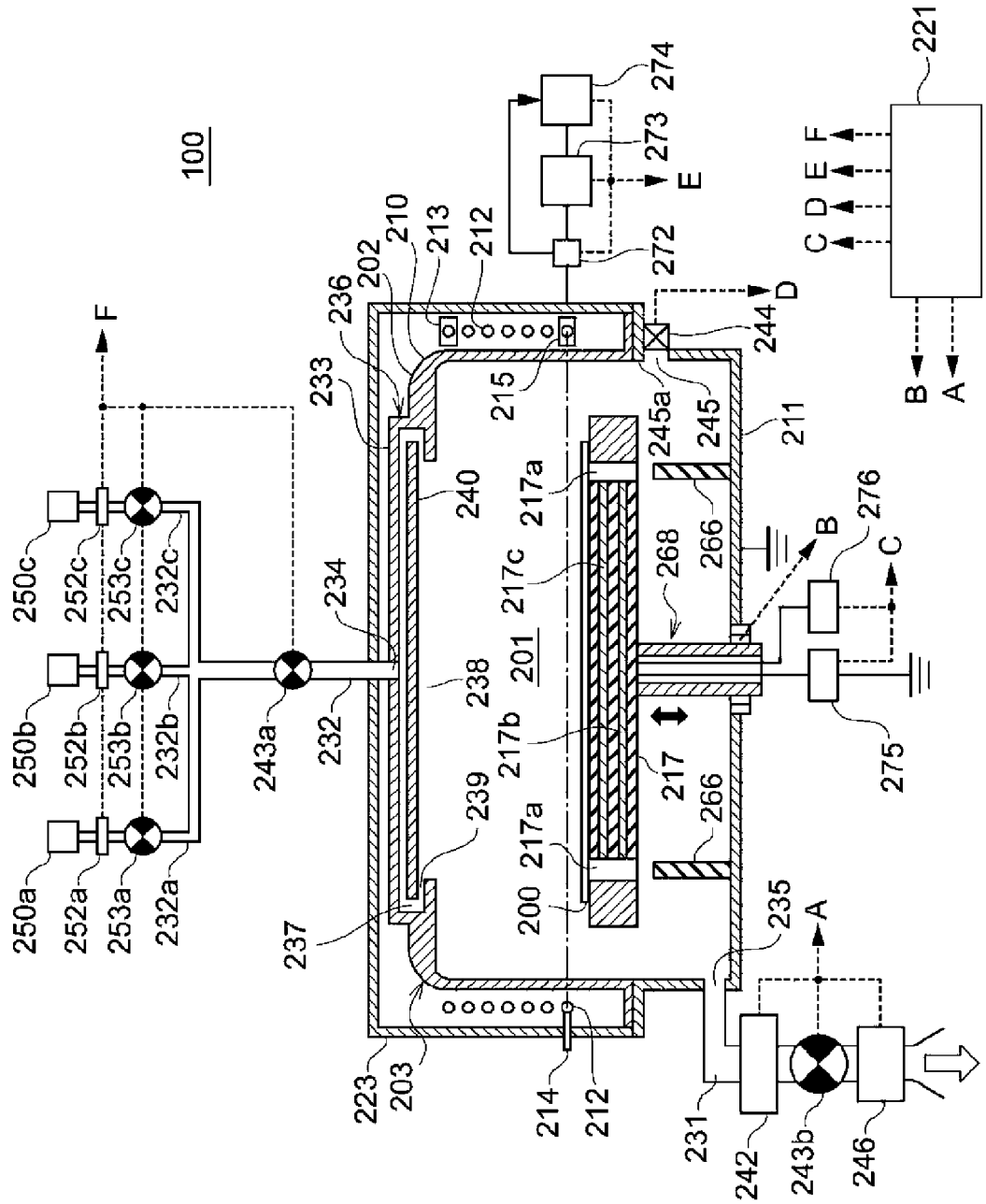
FIG. 3 schematically illustrates the exemplary configuration of the substrate processing apparatus according to the first embodiment described herein when the second oxidizing step is performed.

FIGS. 2 and 3 schematically illustrate an exemplary configuration of the substrate processing apparatus according to the embodiments (that is, a first embodiment according to the technique of the present disclosure). FIG. 2 schematically illustrates the exemplary configuration of the substrate processing apparatus according to the first embodiment when the first oxidizing step is performed, and FIG. 3 schematically illustrates the exemplary configuration of the substrate processing apparatus according to the first embodiment when the second oxidizing step is performed.

Process Chamber

A substrate processing apparatus 100 includes a process furnace 202 in which a wafer (substrate) 200 is processed by the plasma. The process furnace 202 includes a process vessel 203. A process chamber 201 is defined by the process vessel 203. The process vessel 203 includes a dome-shaped upper vessel 210 serving as a first vessel and a bowl-shaped lower vessel 211 serving as a second vessel. By covering the lower vessel 211 with the upper vessel 210, the process chamber 201 is defined.

A gate valve 244 is provided on a lower side wall of the lower vessel 211. While the gate valve 244 is open, the wafer 200 can be transferred (loaded) into the process chamber 201 through a substrate loading/unloading port 245 or can be transferred (unloaded) out of the process chamber 201 through the substrate loading/unloading port 245. While the gate valve 244 is closed, the gate valve 244 maintains the process chamber 201 airtight.

Figure 4:
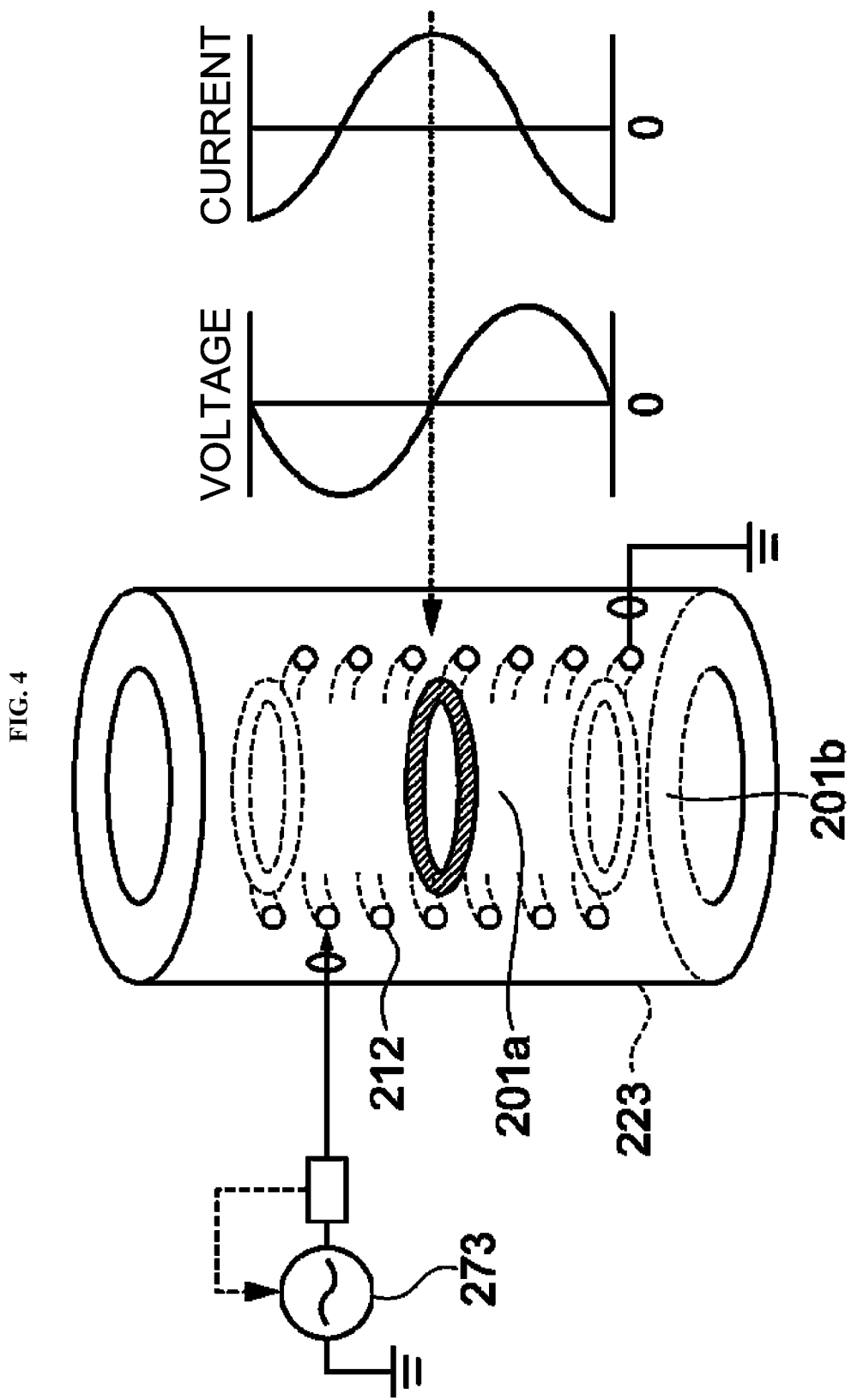
FIG. 4 schematically illustrates a principle of generating a plasma in substrate processing apparatuses according to embodiments described herein.

As shown in FIG. 4 described later, the process chamber 201 includes a plasma generation space 201a in which a resonance coil 212 is provided around the process chamber 201 and a substrate processing space 201b that communicates with the plasma generation space 201a and in which the wafer 200 is processed. The plasma generation space 201a refers to a space where the plasma is generated, for example, a space above a lower end (indicated by a dot-and-dash line in FIGS. 2 and 3) of the resonance coil 212 and below an upper end of the resonance coil 212 in the process chamber 201. The substrate processing space 201b refers to a space in which the substrate (that is, the wafer 200) is processed by the plasma, for example, a space below the lower end of the resonance coil 212.

Susceptor

A susceptor (which is a substrate mounting table) 217 serving as a part of substrate mounting table is provided at a center of a bottom portion of the process chamber 201. The wafer 200 can be placed on the susceptor 217.

A heater 217b serving as a heating apparatus (heating structure) is integrally embedded in the susceptor 217. When electric power is supplied to the heater 217b through a heater power regulator 276, the heater 217b is configured to heat the wafer 200 such that the wafer 200 is heated to a temperature ranging, for example, from about 25° C. to about 1,000° C.

The susceptor 217 is electrically insulated from the lower vessel 211. An impedance adjustment electrode 217c is provided in the susceptor 217. The impedance adjustment electrode 217c is grounded via a variable impedance regulator 275 serving as an impedance adjusting structure. The variable impedance regulator 275 is constituted by components such as a coil (not shown) and a variable capacitor (not shown). The variable impedance regulator 275 is configured to change an impedance thereof from about 0Ω to a parasitic impedance value of the process chamber 201 by controlling the inductance and resistance of the coil (not shown) and the capacitance value of the variable capacitor (not shown). Therefore, it is possible to control the potential (bias voltage) of the wafer 200 via the impedance adjustment electrode 217c and the susceptor 217.

A susceptor elevator 268 configured to elevate and lower the susceptor 217 is provided at the susceptor 217. Through-holes 217a are provided at the susceptor 217, and support pins 266 are provided at a bottom of the lower vessel 211 corresponding to the through-holes 217a. The support pins 266 serve as a support capable of supporting the wafer 200. For example, at least three of the through-holes 217a and at least three of the support pins 266 are provided at positions facing each other. When the susceptor 217 is lowered by the susceptor elevator 268, the support pins 266 pass through the through-holes 217a, respectively, and protrude from a substrate placing surface 217d of the susceptor 217.

The substrate mounting table according to the present embodiment is constituted mainly by the susceptor 217, the heater 217b and the impedance adjustment electrode 217c.

Gas Supplier

A gas supply head 236 is provided above the process chamber 201, that is, on an upper portion of the upper vessel 210. The gas supply head 236 includes a cap-shaped lid 233, a gas inlet port 234, a buffer chamber 237, an opening 238, a shield plate 240 and a gas outlet port 239. The gas supply head 236 is configured to supply a gas such as the oxygen-containing gas into the process chamber 201. The buffer chamber 237 functions as a dispersion space configured to disperse the gas introduced (supplied) through the gas inlet port 234.

A downstream end of a gas supply pipe 232a configured to supply a hydrogen gas (H2 gas), a downstream end of a gas supply pipe 232b configured to supply an oxygen gas (O2 gas), a downstream end of a gas supply pipe 232c configured to supply a nitrogen gas (N2 gas) or an inert gas are connected to join the gas inlet port 234. A H2 gas supply source 250a, a mass flow controller (MFC) 252a serving as a flow rate controller (flow rate controlling structure) and a valve 253a serving as an opening/closing valve are sequentially provided in order from an upstream side to a downstream side of the gas supply pipe 232a. An O2 gas supply source 250b, an MFC 252b and a valve 253b are sequentially provided in order from an upstream side to a downstream side of the gas supply pipe 232b. A N2 gas supply source 250c, an MFC 252c and a valve 253c are sequentially provided in order from an upstream side to a downstream side of the gas supply pipe 232c. A valve 243a is provided on a downstream side where the gas supply pipe 232a, the gas supply pipe 232b and the gas supply pipe 232c join. The valve 243a is connected to an upstream end of the gas inlet port 234. It is possible to supply various gases such as the hydrogen gas, the oxygen gas and the nitrogen gas into the process chamber 201 via the gas supply pipes 232a, 232b and 232c by opening and closing the valves 253a, 253b, 253c and 243a while adjusting flow rates of the respective gases by the MFCs 252a, 252b and 252c.

A hydrogen gas supply system is constituted by the gas supply head 236 (that is, the lid 233, the gas inlet port 234, the buffer chamber 237, the opening 238, the shield plate 240 and the gas outlet port 239), the gas supply pipe 232a, the MFC 252a and the valves 253a and 243a.

An oxygen gas supply system is constituted by the gas supply head 236, the gas supply pipe 232b, the MFC 252b and the valves 253b and 243a.

A nitrogen gas supply system is constituted by the gas supply head 236, the gas supply pipe 232c, the MFC 252c and the valves 253c and 243a.

The gas supplier (which is a gas supply system) may be constituted by the hydrogen gas supply system, the oxygen gas supply system and the nitrogen gas supply system. The substrate processing apparatus 100 according to the present embodiment is configured to supply at least the oxygen gas through the gas supplier. That is, the gas supplier may be provided without the hydrogen gas supply system and the nitrogen gas supply system.

Exhauster

A gas exhaust port 235 is provided on a side wall of the lower vessel 211. The gas is exhausted from the process chamber 201 through the gas exhaust port 235. An upstream end of a gas exhaust pipe 231 is connected to the gas exhaust port 235. An APC (Automatic Pressure Controller) valve 242 serving as a pressure regulator (pressure adjusting structure), a valve 243b and a vacuum pump 246 serving as a vacuum exhaust apparatus are sequentially provided in order from an upstream side to a downstream side of the gas exhaust pipe 231.

An exhauster (which is an exhaust system) is constituted mainly by the gas exhaust port 235, the gas exhaust pipe 231, the APC valve 242 and the valve 243b. The exhauster may further include the vacuum pump 246.

Plasma Generator

The resonance coil 212 of a helical shape is provided so as to surround the process chamber 201 around an outer periphery of the process chamber 201, that is, around an outer portion of a side wall of the upper vessel 210. An RF (Radio Frequency) sensor 272, a high frequency power supply 273 and a frequency matcher (also simply referred to as a "matcher") 274 are connected to the resonance coil 212.

The high frequency power supply 273 is configured to supply a high frequency power to the resonance coil 212. The RF sensor 272 is provided at an output side of the high frequency power supply 273. The RF sensor 272 monitors information of the traveling wave or reflected wave of the supplied high frequency power. The frequency matcher 274 serving as a frequency controller performs a frequency matching operation by controlling the high frequency power supply 273 so as to minimize the reflected wave based on the information of the reflected wave monitored by the RF sensor 272.

Both ends of the resonance coil 212 are electrically grounded. However, at least one end of the resonance coil 212 may be grounded via a movable tap 213 in order to fine-tune an electrical length of the resonance coil 212 when the substrate processing apparatus 100 is initially installed or the processing conditions of the substrate processing apparatus 100 are changed in order for the resonance characteristics of the resonance coil 212 to become approximately same as those of the high frequency power supply 273. A reference numeral 214 shown in FIGS. 2 and 3 indicates a fixed ground of the other end of the resonance coil 212. In addition, in order to fine-tune the impedance of the resonance coil 212 when the substrate processing apparatus 100 is initially installed or the processing conditions of the substrate processing apparatus 100 are changed, a power feeder (not shown) is constituted by a movable tap 215 between the grounded ends of the resonance coil 212.

A shield plate 223 is provided to shield the leakage of the electromagnetic wave to the outside of the resonance coil 212 and to form a capacitive component of the resonance coil 212 for constructing a resonance circuit.

The plasma generator is constituted mainly by the resonance coil 212, the RF sensor 272 and the frequency matcher 274. The plasma generator may further include the high frequency power supply 273.

Hereinafter, the principle of plasma generation in the substrate processing apparatus 100 according to the present embodiment and the properties of the generated plasma will be described with reference to FIG. 4. As shown in FIG. 4, the resonance coil 212 serving as an electrode for discharging is spirally wound around a quartz dome (that is, the upper vessel 210). When a so-called λ-ICP electrode is employed as the electrode which is a high frequency inductively coupled plasma electrode (ICP electrode), both ends of the electrode are grounded, and the electrode length between the grounded ends is adjusted to be almost the same as the wavelength of the applied high frequency power.

A winding diameter, a winding pitch and the number of winding turns of the resonance coil 212 are set such that the resonance coil 212 resonates in a full-wavelength mode to form a standing wave of a predetermined wavelength. That is, the electrical length of the resonance coil 212 is set to an integral multiple of a wavelength of a predetermined frequency of the high frequency power supplied from the high frequency power supply 273.

Specifically, considering the conditions such as the power to be applied, a strength of a magnetic field to be generated and shapes of the substrate processing apparatus 100 to be applied, the resonance coil 212 whose effective cross-section is from 50 mm$^2$ to 300 mm$^2$ and whose diameter is from 200 mm to 500 mm is wound, for example, twice to 60 times around an outer circumferential side of the process chamber 201 defining the plasma generation space 201a such that the magnetic field of about 0.01 Gauss to about 10 Gauss can be generated by the high frequency power whose frequency is from 800 kHz to 50 MHz and whose power is from 0.5 KW to 5 KW, more preferably, from 1.0 KW to 4.0 KW.

The high frequency power supply 273 includes a power supply controller (not shown) and an amplifier (not shown). The power supply controller includes a high frequency oscillation circuit (not shown) and a preamplifier (not shown) in order to adjust an oscillation frequency and an output. The amplifier amplifies the output to a predetermined output level. The power supply controller controls the amplifier based on output conditions relating to the frequency and the power, which are set in advance through an operation panel (not shown), and the amplifier supplies a constant high frequency power to the resonance coil 212 via a transmission line.

The frequency matcher 274 is configured to detect the power of the reflected wave from the resonance coil 212 when the plasma is generated, and to increase or decrease the oscillation frequency with respect to the predetermined frequency such that the power of the reflected wave is minimized. Specifically, the frequency matcher 274 includes a frequency control circuit (not shown) configured to adjust a preset oscillation frequency. The RF sensor 272 is provided on an output side of the amplifier of the high frequency power supply 273 in order to detect the power of the reflected wave via the transmission line and to feed back the voltage signal thereof to the frequency control circuit.

The frequency control circuit oscillates at an unloaded resonance frequency of the resonance coil 212 before the plasma is turned on, and oscillates the frequency increased or decreased from the preset frequency after the plasma is turned on so that the power of the reflected wave is minimized. As a result, the frequency control circuit supplies the frequency signal to the high frequency power supply 273 such that the reflected wave in the transmission line becomes zero.

The resonance coil 212 more accurately form the standing wave since the high frequency power resonating accurately is output by compensating for the deviation of the resonance point in the resonance coil 212 when the plasma is generated and when the conditions for generating the plasma are changed. That is, as shown in FIG. 4, the standing wave in which the phase voltage thereof and the opposite phase voltage thereof are always canceled by each other is generated in the resonance coil 212 by the transmission of an actual resonance frequency of the resonance coil 212 reflecting the influence of the plasma, and the highest phase current is generated at an electric midpoint of the resonance coil 212 (node with zero voltage). Therefore, the induction plasma excited at the electric midpoint is almost not capacitively coupled with the walls of the process chamber 201 or the substrate mounting table. As a result, the donut-shaped plasma with extremely low electric potential is generated in the plasma generation space 201a.

Controller

Figure 5:
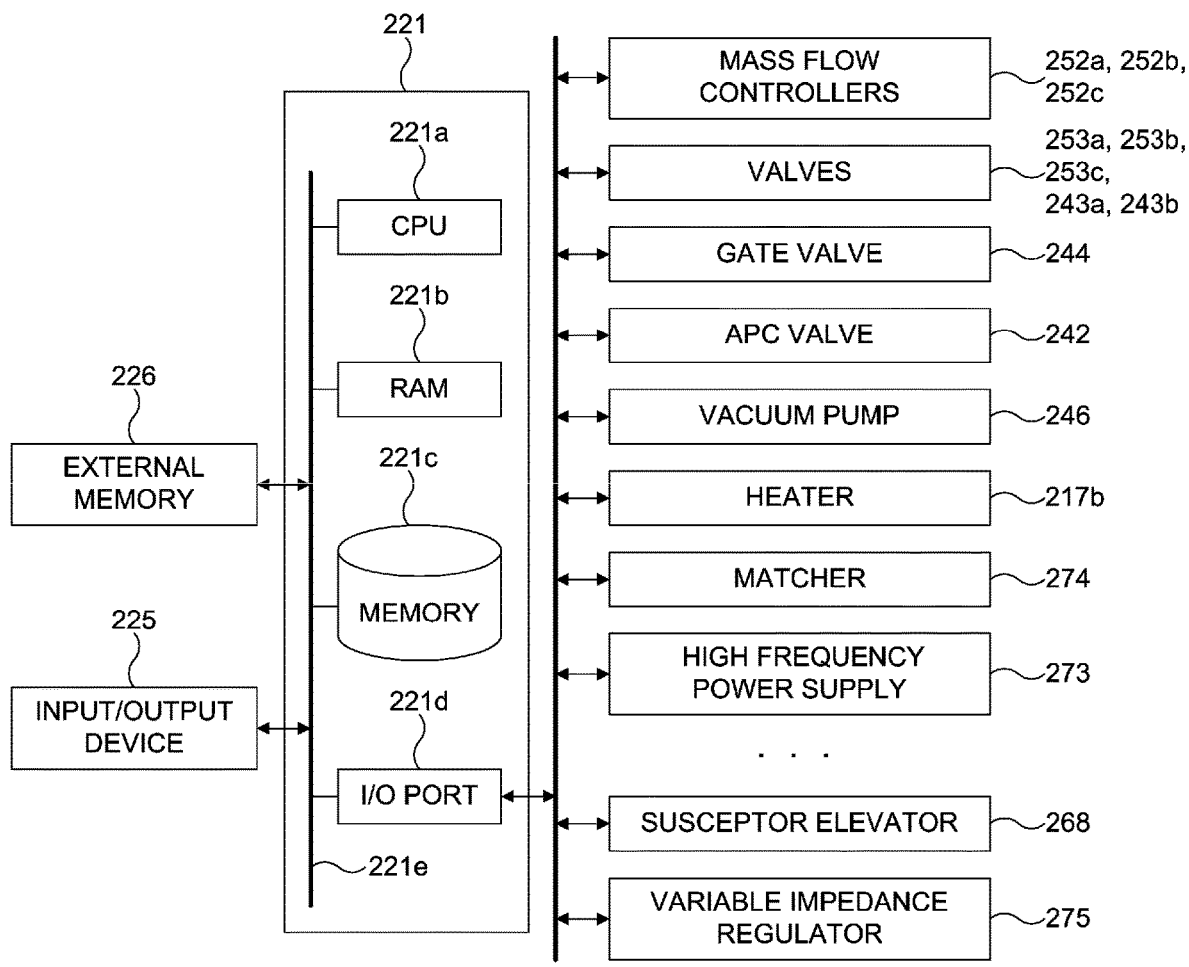
FIG. 5 is a block diagram schematically illustrating a configuration of a controller and related components of the substrate processing apparatuses according to the embodiments described herein.
Figure 6:
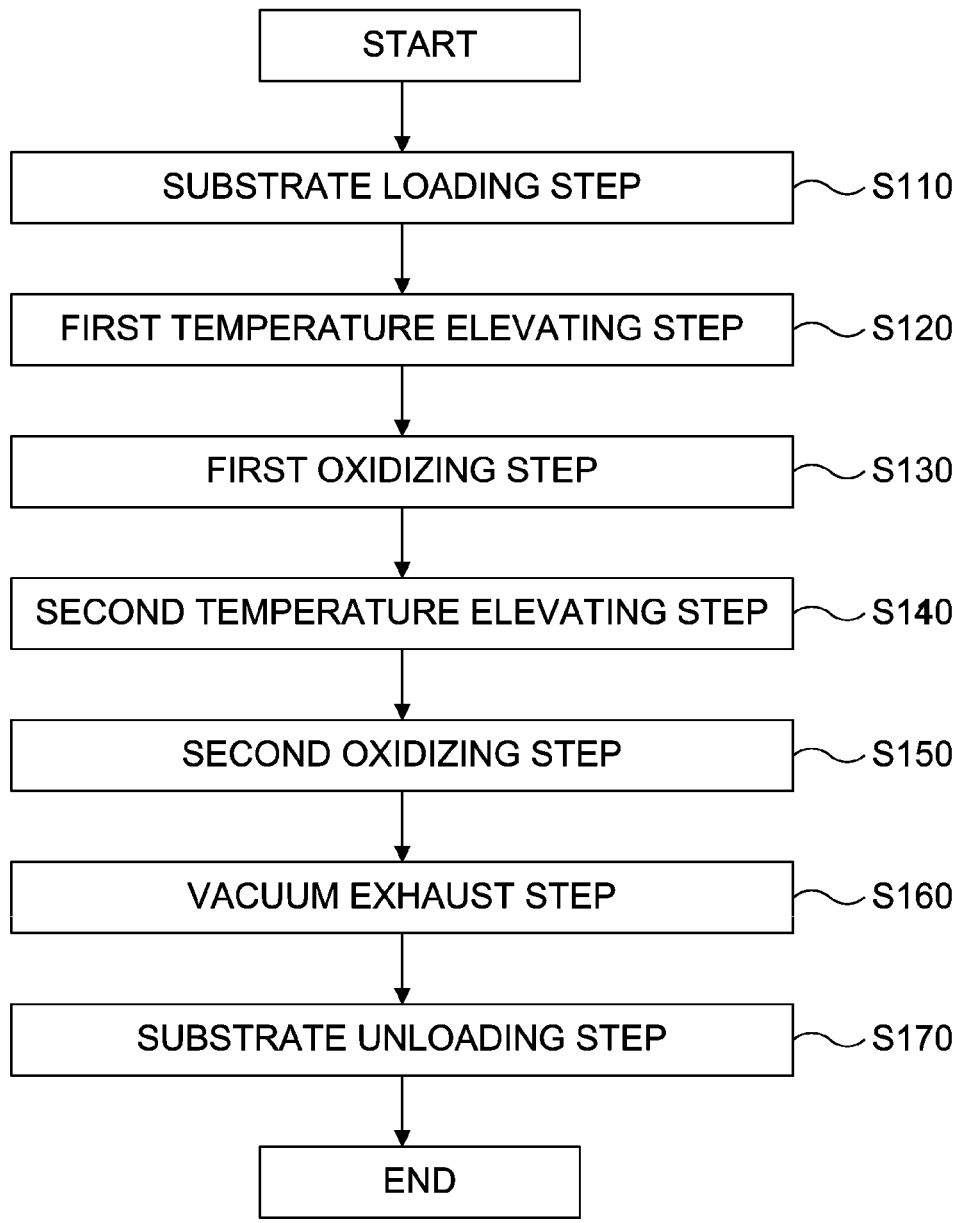
FIG. 6 is a flow chart schematically illustrating a substrate processing according to the embodiments described herein.

As shown in FIG. 5, a controller 221 serving as a control apparatus is embodied by a computer including a CPU (Central Processing Unit) 221a, a RAM (Random Access Memory) 221b, a memory 221c and an I/O port 221d. The RAM 221b, the memory 221c and the I/O port 221d may exchange data with the CPU 221a through an internal bus 221e. For example, an input/output device 225 such as a touch panel, a mouse, a keyboard and an operation terminal (not shown) is connected to the controller 221. A display (not shown) serving as a display structure may be connected to the controller 221.

The memory 221c may be embodied by components such as a flash memory, a HDD (Hard Disk Drive) and a CD-ROM. Components such as a control program configured to control the operation of the substrate processing apparatus 100 and a process recipe in which information such as the order and the conditions of a substrate processing described later is stored may be readably stored in the memory 221c. The process recipe is obtained by combining steps of the substrate processing described later such that the controller 221 can execute the steps to acquire a predetermine result, and functions as a program.

For example, the program causes, by the computer, the substrate processing apparatus 100 to perform: a first oxidizing sequence of forming the first oxide layer by modifying the surface of the substrate provided in the process chamber 201 of the substrate processing apparatus 100 at the first temperature with the plasma of the first oxygen-containing gas; and a second oxidizing sequence of forming the second oxide layer thicker than the first oxide layer by heating the substrate to the second temperature higher than the first temperature and modifying the surface of the substrate, on which the first oxide layer formed, with the plasma of the second oxygen-containing gas. The RAM 221b functions as a memory area (work area) where a program or data read by the CPU 221a is temporarily stored.

The I/O port 221d is electrically connected to the above-described components such as the MFCs 252a, 252b and 252c, the valves 253a, 253b, 253c, 243a and 243b, the gate valve 244, the APC valve 242, the vacuum pump 246, the heater 217b, the RF sensor 272, the high frequency power supply 273, the frequency matcher 274, the susceptor elevator 268 and the variable impedance regulator 275.

The CPU 221a is configured to read and execute the control program stored in the memory 221c, and to read the process recipe stored in the memory 221c in accordance with an instruction such as an operation command inputted via the input/output device 225. The CPU 221a is configured to control the operation of the substrate processing apparatus 100 according to the process recipe. For example, as shown in FIGS. 2 and 3, the CPU 221a may be configured to perform the operation, according to the process recipe, such as an operation of adjusting an opening degree of the APC valve 242, an opening/closing operation of the valve 243b and a start and stop of the vacuum pump 246 via the I/O port 221d and a signal line "A", an elevating and lowering operation of the susceptor elevator 268 via the I/O port 221d and a signal line "B", a power supply amount adjusting operation (temperature adjusting operation) to the heater 217b by the heater power regulator 276 based on the temperature detected by a temperature sensor (not shown) and an impedance adjusting operation by the variable impedance regulator 275 via the I/O port 221d and a signal line "C", an opening/closing operation of the gate valve 244 via the I/O port 221d and a signal line "D", a controlling operation of the RF sensor 272, the frequency matcher 274 and the high frequency power supply 273 via the I/O port 221d and a signal line "E", and gas flow rate adjusting operations of the MFCs 252a, 252b and 252c and opening/closing operations of the valves 253a, 253b, 253c and 243a via the I/O port 221d and a signal line "F".

The controller 221 may be embodied by installing the above-described program stored in an external memory 226 into the computer. For example, the external memory 226 may include a magnetic tape, a magnetic disk such as a flexible disk and a hard disk, an optical disk such as a CD and a DVD, a magneto-optical disk such as an MO and a semiconductor memory such as a USB memory and a memory card. The memory 221c or the external memory 226 may be embodied by a non-transitory computer readable recording medium. Hereafter, the memory 221c and the external memory 226 may be collectively or individually referred to as a recording medium. In the present specification, the term "recording medium" may indicate only the memory 221c, may indicate only the external memory 226, and may indicate both of the memory 221c and the external memory 226. The program may be provided to the computer without using the external memory 226. For example, the program may be supplied to the computer using a communication means such as the Internet and a dedicated line.

Method of Manufacturing Semiconductor Device

Figure 10:
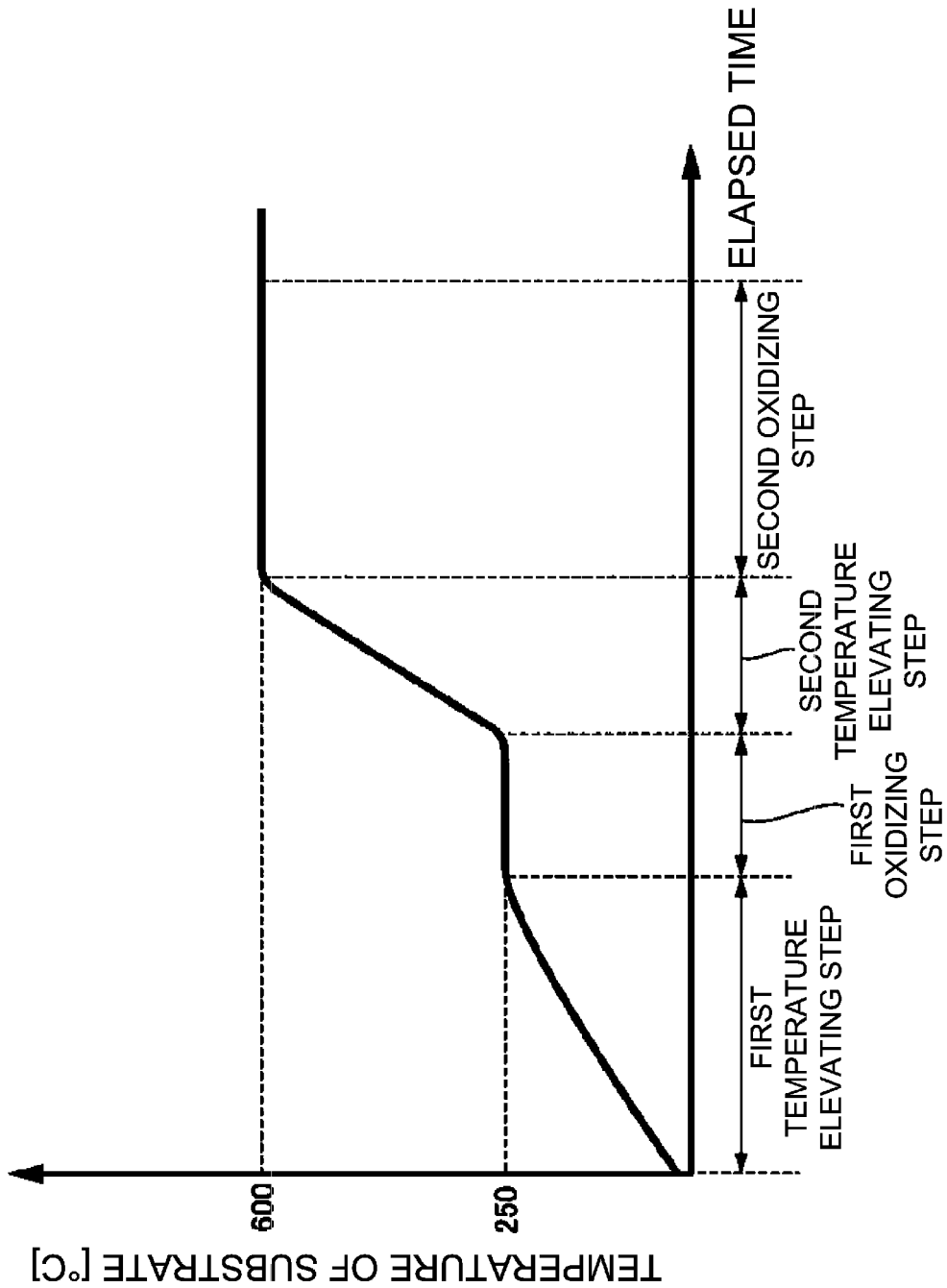
FIG. 10 schematically illustrates an exemplary relationship between a time transition of a temperature of a substrate to be processed and each step in the substrate processing according to the embodiments described herein.

Subsequently, the substrate processing of processing the substrate in accordance with the method of manufacturing the semiconductor device according to the present embodiment will be described. For example, the substrate processing according to the present embodiment, which is a part of manufacturing processes of the semiconductor device such as a flash memory, is performed by the substrate processing apparatus 100 described above. In the following description, the operations of the components constituting the substrate processing apparatus 100 are controlled by the controller 221. FIG. 10 schematically illustrates an exemplary relationship between a time transition of a temperature of the substrate to be processed (that is, the wafer 200) and each step in the substrate processing according to the present embodiment.

Substrate

When performing the method of manufacturing the semiconductor device according to the present embodiment, the substrate (that is, the substrate to be processed) is not particularly limited and can be appropriately selected according to the application of the semiconductor device to be manufactured. As the substrate to be processed, instead of a semiconductor substrate such as a silicon substrate and a compound semiconductor substrate, an insulating substrate such as a glass substrate may be used. Further, a substrate including a flat surface on which the oxide layer is formed or a substrate including a film on a surface thereof may be used as the substrate to be processed. Further, a substrate including a convex-concave structure on a surface thereof by performing a part of a manufacturing process of the semiconductor device may be used as the substrate to be processed.

The method of manufacturing the semiconductor device according to the present embodiment can be preferably applied to a process of manufacturing the semiconductor device by processing a substrate including a film doped with the impurities on a surface thereof. In the present specification, the term "a film doped with the impurities" may also refer to a layer containing the impurities formed on the surface of the substrate by directly doping a base (for example, the silicon substrate itself) constituting the substrate itself. As the film formed on the surface of the substrate, for example, a silicon-containing film, specifically, a poly-silicon film may be used. The impurities (dopants) doped in the film are not particularly limited. For example, an element such as phosphorus (P), arsenic (As), antimony (Sb), boron (B) and aluminum (Al) may be used as the impurities.

Oxygen-Containing Gas

As the first oxygen-containing gas used in the first oxidizing step and the second oxygen-containing gas used in the second oxidizing step, a gas (that is, the oxygen-containing gas) containing at least oxygen (O) may be used. For example, a gas such as the $O_2$ gas alone, a mixed gas of the $O_2$ gas and the $H_2$ gas, $H_2O$ gas (water vapor), $H_2O_2$ gas and ozone ($O_3$) gas alone may be used as the oxygen-containing gas. It is preferable that at least one of the first oxygen-containing gas and the second oxygen-containing gas is a gas containing hydrogen (H) in addition to oxygen (O). When the oxygen-containing gas contains hydrogen in addition to oxygen, it is possible to improve the oxidation rate. As the oxygen-containing gas containing hydrogen and oxygen, the $H_2O$ gas (water vapor) may be used. However, it is preferable that the mixed gas of the $O_2$ gas and the $H_2$ gas is used as the oxygen-containing gas containing hydrogen and oxygen from the viewpoint of improving the oxidation rate, handling of the oxygen-containing gas containing hydrogen and oxygen and easily adjusting a ratio of oxygen and hydrogen in the oxygen-containing gas by changing flow rates of the $O_2$ gas and the $H_2$ gas contained in the mixed gas. Further, at least one of the first oxygen-containing gas and the second oxygen-containing gas may be the $O_2$ gas.

For example, components of the oxygen-containing gas used in the first oxidizing step and components of the oxygen-containing gas used in the second oxidizing step may be different. That is, an oxygen amount in the oxygen-containing gas used in the first oxidizing step may be different from an oxygen amount in the oxygen-containing gas used in the second oxidizing step. However, it is preferable that a material composition of the oxygen-containing gas used in the first oxidizing step and a component composition of the oxygen-containing gas used in the second oxidizing step are the same. By using the gas of the same material composition in both the first oxidizing step and the second oxidizing step, it is possible to perform the first oxidizing step and the second oxidizing step without switching the oxygen-containing gas in the first oxidizing step and the second oxidizing step. Therefore, it is possible to simplify the manufacturing process and to improve throughput. In addition, it is possible to simplify the configuration of the apparatus such as the substrate processing apparatus 100 by eliminating the need for a new gas supply system.

Substrate Loading Step S110

First, the gate valve 244 is opened, and the wafer 200 serving as the substrate to be processed is transferred (loaded) into the process chamber 201 by a transfer robot (not shown). The wafer 200 may be simply referred to as the wafer or the substrate. The wafer 200 includes the film doped with the impurities on the surface thereof where the oxide layer is formed thereafter. When the wafer 200 is loaded into the process chamber 201, the wafer 200 is placed on the support pins 266 protruding from the substrate placing surface 217d of the susceptor 217. Specifically, the susceptor elevator 268 lowers the susceptor 217 to protrude the support pins 266 from the through-holes 217a of the susceptor 217 by a predetermined height from an upper surface (that is, the substrate placing surface) 217d of the susceptor 217. As shown in FIG. 2, the wafer 200 is placed on the support pins 266 protruding from the substrate placing surface 217d so that the substrate placing surface 217d of the susceptor 217 and the wafer 200 are separated from each other. As a result, the wafer 200 is supported on the support pins 266 in a horizontal orientation.

First Temperature Elevating Step S120

Subsequently, the temperature of the wafer 200 loaded into the process chamber 201 is elevated. The heater 217b embedded in the susceptor 217 is heated in advance. By adjusting a separation distance between the wafer 200 and the susceptor 217 while the wafer 200 loaded into the process chamber 201 is placed on the support pins 266 protruding from the substrate placing surface 217d of the susceptor 217 in which the heater 217b is embedded, it is possible to easily adjust the temperature of the wafer 200 without changing a temperature of the heater 217b embedded in the susceptor 217. For example, the wafer 200 is heated to the first temperature ranging from the room temperature (25° C.) to 300° C. For example, the wafer 200 is heated to 250° C. For example, the numerical range of the temperature ranging "from 25° C. to 300° C." means a temperature equal to or more than 25° C. and equal to or less than 300° C. The same also applies to all numerical ranges described herein such as a pressure and a flow rate. By controlling the temperature (first temperature) of the wafer 200 when the first oxidizing step is performed to 300° C. or lower, it is possible to suppress the dopants in the film on the surface of the wafer 200 from being released into the process chamber 201 in the first oxidizing step. From the viewpoint of suppressing the release of the dopants in the first oxidizing step, it is preferable that the temperature of the wafer 200 is as low as possible. For example, it is possible to form the first oxide layer by the plasma oxidation without heating the wafer 200 loaded into the process chamber 201. Further, from the viewpoint of improving the oxidation rate, it is preferable that the temperature of the wafer 200 is as high as possible. For example, as the first temperature, it is possible to heat the wafer to 200° C. or higher.

While the temperature of the wafer 200 is being elevated, the vacuum pump 246 vacuum-exhausts an inner atmosphere of the process chamber 201 through the gas exhaust pipe 231 such that an inner pressure of the process chamber 201 reaches and is maintained at a predetermined pressure ranging from 0.5 Pa to 250 Pa, preferably from 10 Pa to 200 Pa. The vacuum pump 246 vacuum-exhausts the inner atmosphere of the process chamber 201 at least until a substrate unloading step S170 described later is completed.

First Oxidizing Step S130

In the first oxidizing step, it is preferable to form the first oxide layer while the wafer 200 is supported by the support pins 266 such that the wafer 200 is separated from the substrate placing surface 217d of the susceptor 217. As described above, the support pins 266 are capable of supporting the wafer 200 above the substrate placing surface 217d of the susceptor 217 in which the heater 217b is embedded. After the wafer 200 is heated to the first temperature, the first oxidizing step is performed by supplying the first oxygen-containing gas containing at least oxygen into the process chamber 201 and exciting the first oxygen-containing gas to generate the plasma. By performing the first oxidizing step after the wafer 200 is loaded into the process chamber 201 and while the wafer 200 is supported by the support pins 266, it is possible to easily adjust the temperature of the wafer 200 without changing the temperature of the heater 217b embedded in the susceptor 217. Therefore, it is possible to simplify the process recipe and to improve the throughput.

In the first oxidizing step, the mixed gas of the $O_2$ gas and the $H_2$ gas is supplied into the process chamber 201 as the first oxygen-containing gas. Specifically, the valves 243a, 253a and 253b are opened to supply the $H_2$ gas into the process chamber 201 via the buffer chamber 237 while the flow rate of the $H_2$ gas is adjusted by the MFC 252a. Simultaneously, the $O_2$ gas is supplied into the process chamber 201 via the buffer chamber 237 while the flow rate of the $O_2$ gas is adjusted by the MFC 252b. For example, a ratio (also referred to as a "flow rate ratio") of the $O_2$ gas in the mixed gas supplied into the process chamber 201 is a predetermined ratio of more than or equal to 5% and less than 100%. From the viewpoint of securing the oxidation rate, it is preferable that the predetermined ratio may range from 80% to 98%. More preferably, for example, the predetermined ratio is set to 95%.

For example, by adjusting a ratio of the flow rate of the $H_2$ gas in the mixed gas to the flow rate of the $O_2$ gas in the mixed gas, it is possible to control a ratio of hydrogen active species to oxygen active species supplied to the surface of the wafer 200. That is, by adjusting an opening degree of each of the MFC 252a and 252b, it is possible to control a flow rate ratio of the mixed gas (or the ratio of the hydrogen active species to the oxygen active species). For example, an amount of the $H_2$ gas introduced into the process chamber 201 is set to 50 sccm, and an amount of $O_2$ gas introduced into the process chamber 201 is set to 950 sccm.

The inner atmosphere of the process chamber 201 is exhausted by adjusting the opening degree of the APC valve 242 such that the inner pressure of the process chamber 201 reaches and is maintained at a predetermined pressure. For example, the predetermined pressure is set to 150 Pa.

After a predetermined time elapses from the start of the supply of the mixed gas of the $H_2$ gas and the $O_2$ gas (for example, after several seconds elapse), the high frequency power is applied to the resonance coil 212 from the high frequency power supply 273. For example, the high frequency power of 27.12 MHz ranging from 0.1 KW to 3.5 KW (for example, 2.5 KW) is applied. As a result, a donut-shaped induction plasma is excited at a height corresponding to the electric midpoint of the resonance coil 212 in the plasma generation space 201a. The $H_2$ gas and the $O_2$ gas are activated by the excited plasma and dissociate. As a result, the hydrogen active species (H radicals) and the oxygen active species (O radicals) are generated. In addition, as a reactive species containing oxygen atoms, components such as hydroxyl radicals (OH radicals) and oxygen ions may be generated, and as a reactive species containing hydrogen atoms, components such as hydrogen ions may be generated.

By processing the surface of the wafer 200 with the H radicals and the O radicals generated by the excited plasma, the film formed on the surface of the wafer 200 and doped with the impurities is modified (oxidized) from the surface thereof to form the first oxide layer.

Figure 11:
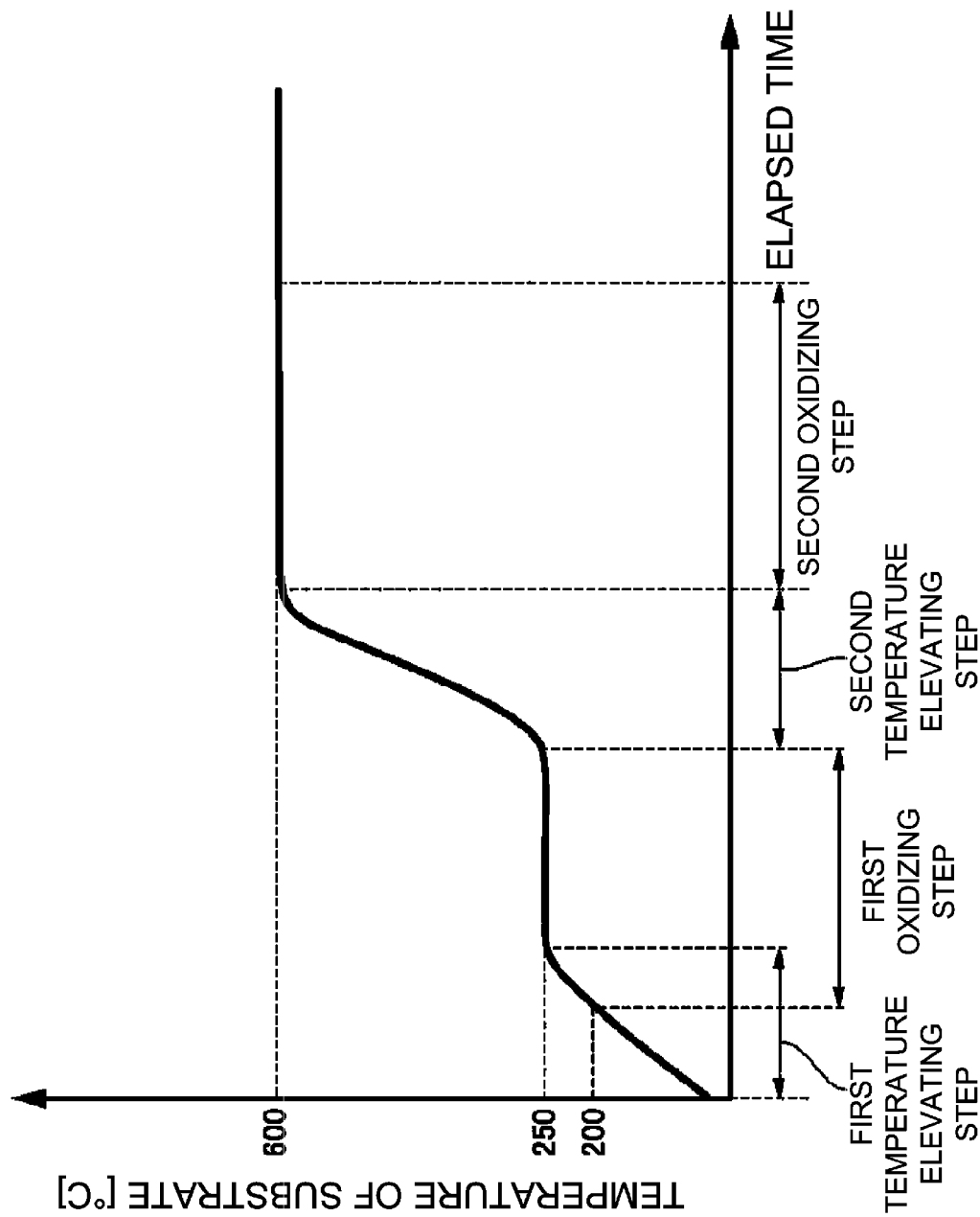
FIG. 11 schematically illustrates another exemplary relationship between the time transition of the temperature of the substrate to be processed and each step in the substrate processing according to the embodiments described herein.

The first oxidizing step may be performed simultaneously with the first temperature elevating step or may be performed while continuously elevating the temperature of the wafer 200 from the first temperature elevating step. FIG. 11 schematically illustrates a relationship between the time transition of the temperature of the wafer 200 and each step in the substrate processing according to a first modified example of the embodiments described herein. According to the first modified example, the susceptor 217 is heated by the heater 217b embedded in the susceptor 217, and the wafer 200 loaded into the process chamber 201 is placed on the support pins 266 to pre-heat the wafer 200. Then, the first oxide layer is formed while the temperature of the wafer 200 is being elevated. If the first oxide layer is formed in the first oxidizing step by additionally pre-heating the wafer 200, it is possible to effectively suppress the wafer 200 from being warped or deformed when the temperature of the wafer 200 is elevated in the second oxidizing step. In such a case, the first oxidizing step is performed with the temperature of the wafer 200 elevated to the first temperature. According to the first modified example shown in FIG. 11, the first oxidizing step is started when the temperature of the wafer 200 is elevated to 200° C., which is the first temperature. That is, in the first modified example, the first temperature is set to a range of 200° C. to 250° C., which is a temperature range of the wafer 200 when the first oxidizing step is performed.

The first oxygen-containing gas used in the first oxidizing step is not limited to the mixed gas of the $H_2$ gas and the $O_2$ gas. For example, the $H_2O$ gas (water vapor) may be used as the first oxygen-containing gas, the $O_2$ gas alone may be used as the first oxygen-containing gas, or the $O_3$ (ozone) may be used as the first oxygen-containing gas. Further, if necessary, a rare gas such as argon (Ar) gas and the $N_2$ gas may be additionally supplied.

Alternatively, the mixed gas may be excited outside the process chamber 201 to generate the plasma, and the generated reactive species such as the active species may be introduced into the process chamber 201. In addition, as another example, a flow rate ratio of the active species may be controlled (adjusted) by separately exciting the $H_2$ gas and the $O_2$ gas and by adjusting a ratio of flow rates of the active species generated respectively therefrom when the active species are introduced into the process chamber 201.

A thickness of the first oxide layer formed in the first oxidizing step is not particularly limited. However, from the viewpoint of more reliably suppressing the desorption of the dopants in the second oxidizing step, the thickness of the first oxide layer is preferably 1.6 nm or more, more preferably 2.0 nm or more. An upper limit of the thickness of the first oxide layer is not particularly limited. However, since the first oxide layer is formed in the first oxidizing step while the temperature of the wafer 200 is lower than that of the wafer 200 in the second oxidizing step, the oxidation rate in the first oxidizing step is slower than the oxidation rate in the second oxidizing step. That is, the thicker the first oxide layer formed in the first oxidizing step, the longer the total process time of forming the oxide layer. Further, since the first oxide layer is formed in the first oxidizing step while the temperature of the wafer 200 is lower than that of the wafer 200 in the second oxidizing step, the desired characteristics of the oxide layer (that is, the first oxide layer) formed in the first oxidizing step may be inferior to those of the oxide layer (that is, the second oxide layer) in the second oxidizing step (for example, an amount of the impurities the first oxide layer may increase so that a density of the first oxide layer may decrease). That is, the thicker the first oxide layer formed in the first oxidizing step, the lower the quality of the entire oxide layer including the oxide layer formed in the second oxidizing step (that is, the second oxide layer described later). Therefore, from the viewpoint of the productivity and the quality of the oxide layer, the thickness of the first oxide layer is more preferably as thin as possible as long as the thickness of the first oxide layer is equal to or greater than a thickness capable of achieving the purpose of suppressing the desorption of the dopants. For example, the thickness of the first oxide layer is preferably set to 4 nm or less, more preferably 2 nm or less.

Second Temperature Elevating Step S140

After performing the first oxidizing step for a predetermined time, the application of the high frequency power to the resonance coil 212 is stopped to stop the plasma oxidation. Subsequently, in order to perform the subsequent second oxidizing step, the temperature of the wafer 200 is elevated to the second temperature higher than the first temperature. While the temperature of the wafer 200 is being elevated to the second temperature, the vacuum pump 246 continuously vacuum-exhausts the inner atmosphere of the process chamber 201.

In the second temperature elevating step, the output of the heater 217b embedded in the susceptor 217 may be increased to elevate the temperature of the wafer 200. However, it is preferable to elevate the temperature of the wafer 200 by elevating the susceptor 217 such that the wafer 200 is placed on the substrate placing surface 217d while maintaining the temperature of the susceptor 217 constant. By placing the wafer 200 on the substrate placing surface 217d of the susceptor 217, it is possible to elevate the temperature of the wafer 200 without changing the temperature (output) of the heater 217b embedded in the susceptor 217. Specifically, as shown in FIG. 3, the susceptor elevator 268 elevates the susceptor 217 such that the susceptor 217 is disposed at a predetermined position between the lower end of the resonance coil 212 and an upper end of the substrate loading/unloading port 245. As a result, the wafer 200 is supported by the upper surface (substrate placing surface) 217d of the susceptor 217. By heating the wafer 200 in contact with the substrate placing surface 217d of the susceptor 217, the temperature of the wafer 200 is elevated to the second temperature higher than the first temperature. In the second temperature elevating step, the wafer 200 may not be placed on the substrate placing surface 217d of the susceptor 217. For example, the temperature of the wafer 200 is elevated to the second temperature when the separation distance between the wafer 200 and the susceptor 217 is reduced by elevating the susceptor 217.

In the second temperature elevating step, the inner pressure of the process chamber 201 may be higher than that of the process chamber 201 in the first temperature elevating step and the first oxidizing step while elevating the temperature of the wafer 200 to the second temperature. Further, the temperature of the wafer 200 may be elevated by increasing the inner pressure of the process chamber 201 while maintaining the wafer 200 separated from the susceptor 217 by the support pins 266 to increase the thermal conductivity from the heater 217b. In such a case, an exhaust amount from the process chamber 201 may be adjusted by an exhaust valve (that is, the valve 243b) to adjust the inner pressure of the process chamber 201. In the second temperature elevating step, the inner pressure of the process chamber 201 may be higher than that of the process chamber 201 in the first oxidizing step. In addition, the susceptor 217 may be elevated such that the separation distance between the wafer 200 and the susceptor 217 is reduced, or the wafer 200 may be placed on the susceptor 217. Thereby, it is possible to elevate the temperature of the wafer 200 to the second temperature more quickly. When the wafer 200 is placed on the substrate placing surface 217d in the second temperature elevating step, it is preferable to temporarily stop the supply of the gas to the process chamber 201 to reduce the inner pressure of the process chamber (that is, to vacuum-exhaust the inner atmosphere of the process chamber 201). Thereby, it is possible to prevent the gas from staying between the substrate placing surface 217d and the wafer 200. For example, it is also possible to prevent the occurrence of the side-slipping or the dislocation of the wafer 200 that occurs when the wafer 200 is placed on the substrate placing surface 217d.

The second temperature is not particularly limited as long as the oxidation rate is higher than the oxidation rate of the first oxidizing step and the second temperature is higher than the first temperature. However, it is preferable that the second temperature is equal to or more than 400° C. and less than 800° C., more preferably equal to or more than 500° C. and less than 700° C. For example, the second temperature is set to about 600° C. By setting the second temperature in the temperature range described above, it is possible to improve the oxidation rate in the second oxidizing step as compared with the first oxidizing step, and it is also possible to improve the quality of the oxide layer. By setting the second temperature to less than 800° C., it is possible to prevent the impurities in the film from being released into the process chamber 201 via the oxide layer or diffused to a location other than the film doped with the impurities.

Second Oxidizing Step S150

After the temperature of the wafer 200 is elevated to the second temperature, the second oxidizing step is performed. In the second oxidizing step, by oxidizing (modifying) the surface of the wafer 200, on which the first oxide layer is formed, using the plasma of the second oxygen-containing gas containing at least oxygen, the second oxide layer thicker than the first oxide layer is formed. Specifically, after the temperature of the wafer 200 is elevated to the second temperature in the second temperature elevating step, the second oxidizing step is performed by supplying the mixed gas of the $O_2$ gas and the $H_2$ gas into the process chamber 201 as the second oxygen-containing gas and plasma-exciting the second oxygen-containing gas by applying the high frequency power to the resonance coil 212.

In the second oxidizing step, the plasma oxidation may be performed in the same manner as in the first oxidizing step except that the temperature of the wafer 200 is set to the second temperature higher than the first temperature. In both the first oxidizing step and the second oxidizing step, the temperature of the wafer 200 itself may not be measured. That is, for example, the temperature of the wafer 200 in the first oxidizing step and the temperature of the wafer 200 in the second oxidizing step may be controlled by setting temperature of the susceptor 217 within a first target temperature range and a second target temperature range, respectively.

Figure 12:
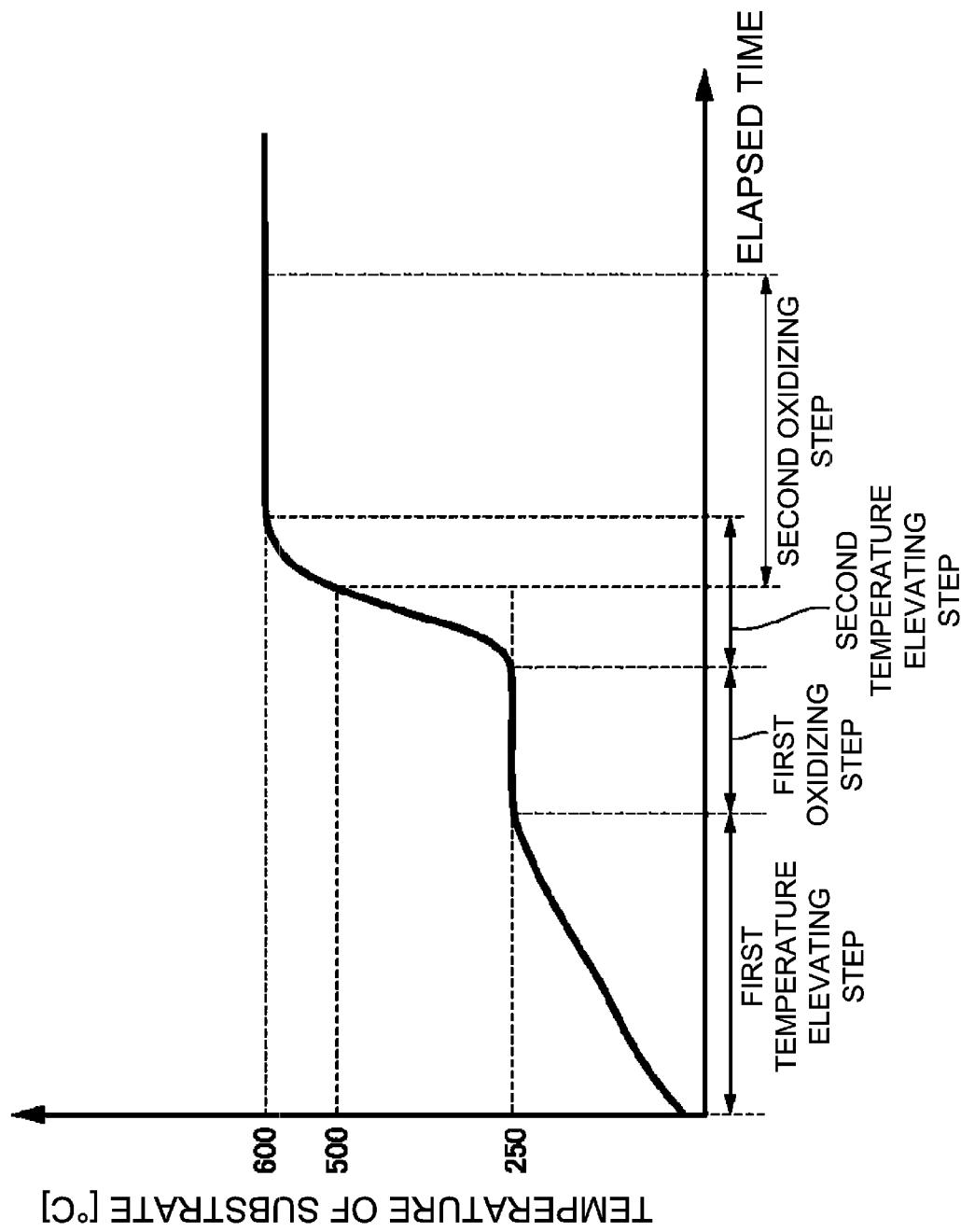
FIG. 12 schematically illustrates still another exemplary relationship between the time transition of the temperature of the substrate to be processed and each step in the substrate processing according to the embodiments described herein.

The second oxidizing step may be performed simultaneously with the second temperature elevating step or may be performed while continuously elevating the temperature of the wafer 200 from the second temperature elevating step. FIG. 12 schematically illustrates a relationship between the time transition of the temperature of the wafer 200 and each step in the substrate processing according to a second modified example of the embodiments described herein. According to the second modified example, the second oxidizing step is performed by heating the wafer 200 while being supported by the upper surface (substrate placing surface) 217d of the susceptor 217 and plasma-exciting the second oxygen-containing gas while continuously elevating the temperature of the wafer 200 at the second temperature.

In the second modified example shown in FIG. 12, the second oxidizing step is started when the temperature of the wafer 200 is elevated to 500° C., which is the second temperature. That is, in the second modified example, the second temperature is set to a range of 500° C. to 600° C., which is a temperature range of the wafer 200 when the second oxidizing step is performed. By performing the second oxidizing step while elevating the temperature of the wafer 200 on the upper surface 217d of the susceptor 217, it is possible to start the second oxidizing step from a relatively low temperature while the temperature of the wafer 200 is being elevated. Thereby, it is possible to shorten a time to form the second oxide layer of a desired thickness. However, from the viewpoint of improving the quality of the second oxide layer, it is preferable that the second oxidizing step is performed by heating the wafer 200 while being supported by the upper surface 217d of the susceptor 217 and plasma-exciting the second oxygen-containing gas after the temperature of the wafer 200 is stabilized at a desired temperature (a temperature sufficiently high to obtain a desired quality of the second oxide layer).

For example, a thickness of the second oxide layer (which is a final oxide layer) may be appropriately determined according to the application of the semiconductor device to be manufactured, the function of the semiconductor device and the like. It is preferable that the thickness of the second oxide layer is at least greater than the thickness of the first oxide layer. Further, from the viewpoint of, for example, the productivity described later, the thickness of the second oxide layer is preferably 5 nm or more, more preferably 7 nm or more. Further, considering the thickness of the oxide layer that can be formed under economically rational conditions by the plasma oxidation process using the substrate processing apparatus 100 according to the present embodiment, for example, the thickness of the second oxide layer is 20 nm or less, more practically 15 nm or less.

When forming the second oxide layer thicker than the first oxide layer in the second oxidizing step, an amount of increase in the thickness of the oxide layer in the second oxidizing step, that is, a value obtained by subtracting the thickness of the first oxide layer from the thickness of the second oxide layer is not particularly limited. The amount of the increase in the thickness of the oxide layer in the second oxidizing step may be smaller than the thickness of the first oxide layer. However, since the oxidation rate in the first oxidizing step is slower than the oxidation rate in the second oxidizing step, the thicker the thickness of the first oxide layer, the longer the time of the entire oxidizing step. Therefore, from the viewpoint of the productivity, the thickness of the second oxide layer is preferably twice or more the thickness of the first oxide layer. That is, when the thickness (the amount of the increase in the thickness) of the oxide layer additionally formed in the second oxidizing step is equal to or greater than the thickness of the first oxide layer, it is possible to remarkably improve the oxidation rate and to remarkably improve the productivity as compared with a case where an oxide layer of the same thickness as the second oxide layer is formed in the first oxidizing step without performing the second oxidizing step.

After the second oxidizing step, the supply of the high frequency power from the high frequency power supply 273 is stopped to stop a plasma discharge in the process chamber 201. In addition, the valves 253a and 253b are closed to stop the supply of the H$_2$ gas and the O$_2$ gas into the process chamber 201.

Vacuum Exhaust Step S160

After the supply of the H$_2$ gas and the O$_2$ gas is stopped, the inner atmosphere of the process chamber 201 is vacuum-exhausted through the gas exhaust pipe 231. As a result, the gas such as the H$_2$ gas, the O$_2$ gas and an exhaust gas containing residues in the process chamber 201 is exhausted to the outside of the process chamber 201. Thereafter, the opening degree of the APC valve 242 is adjusted such that the inner pressure of the process chamber 201 is adjusted to the same pressure as that of a vacuum transfer chamber (not shown) provided adjacent to the process chamber 201.

Substrate Unloading Step S170

After the inner pressure of the process chamber 201 reaches and is maintained at a predetermined pressure, the susceptor 217 is lowered to a position of transferring the wafer 200 until the wafer 200 is supported by the support pins 266. Then, the gate valve 244 is opened and the wafer 200 is unloaded out of the process chamber 201 by using a transfer device (not shown). Thereby, the substrate processing according to the present embodiment is completed.

As described above, with respect to the wafer 200 including the film doped with the impurities on the surface thereof, the first oxide layer is formed by modifying the film by the plasma oxidation at a relatively low temperature, the temperature of the wafer 200 is elevated, and then the second oxide layer thicker than the first oxide layer is formed by the plasma oxidation. Thereby, it is possible to efficiently form the oxide layer of a desired thickness. It is also possible to suppress the contamination of the process chamber 201 due to the release of the dopants and to effectively suppress the diffusion of the dopants to a location other than the film containing the dopants. In the method of manufacturing the semiconductor device according to the embodiments, when the first temperature elevating step, the first oxidizing step, the second temperature elevating step and the second oxidizing step are sequentially performed as described above, the temperature of the wafer 200 in each oxidizing step may not be measured.

Second Embodiment

Hereinafter, a second embodiment according to the technique of the present disclosure will be described with reference to FIG. 7. The same components as those of the first embodiment will be denoted by like reference numerals, and detailed description thereof will be omitted.

Figure 7:
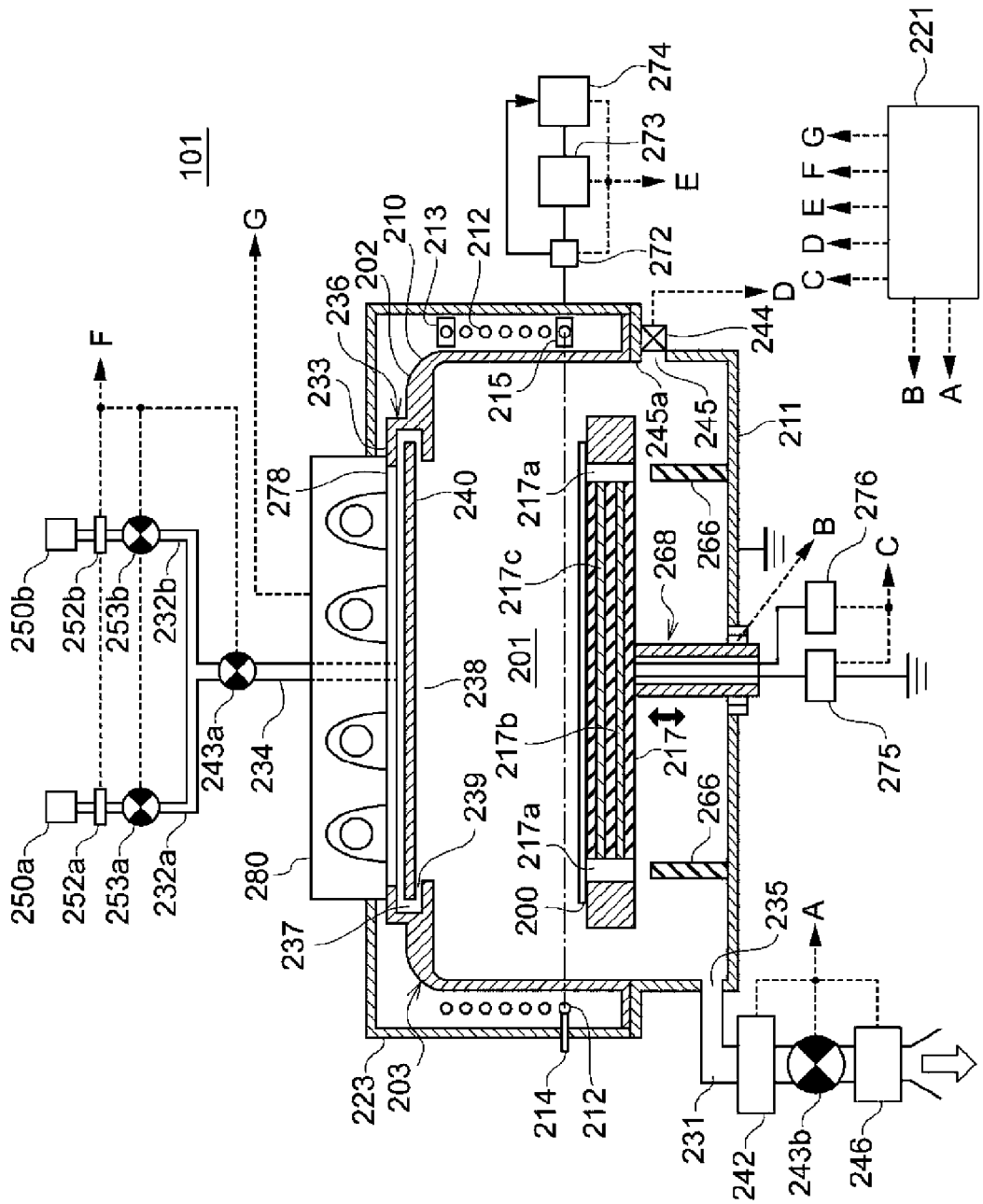
FIG. 7 schematically illustrates an exemplary configuration of a substrate processing apparatus according to a second embodiment described herein.

FIG. 7 schematically illustrates an exemplary configuration of a substrate processing apparatus 101 according to the second embodiment described herein. The substrate processing apparatus 101 according to the present embodiment includes a lamp heater 280 capable of heating the wafer 200. The lamp heater 280 includes a lamp above the susceptor 217 to heat the wafer 200. Specifically, a light transmitting window 278 is provided above the process chamber 201 (that is, above the upper vessel 210), and the lamp heater 280 is installed outside the process vessel 203 on the light transmitting window 278. The lamp heater 280 is provided at a position facing the susceptor 217, and is configured to heat the wafer 200 from above the wafer 200 through the light transmitting window 278 that transmits light and the shield plate 240. Further, the controller 221 serving as the control apparatus is configured to control the lamp heater 280 through a signal line "G". By lighting (turning on) the lamp heater 280, it is possible to heat the wafer 200 in a shorter time as compared with a case where the wafer 200 is heated by the heater 217b. Further, by using the heater 217b in combination with the lamp heater 280, it is possible to quickly heat the wafer 200 to a high temperature. For example, it is possible to quickly elevate the temperature of the wafer 200 to 900° C.

When the surface of the wafer 200 is modified to form the oxide layer by using the substrate processing apparatus 101 according to the present embodiment, a substrate loading step to a first oxidizing step of the second embodiment may be performed similar to the first embodiment using the substrate processing apparatus 100. That is, the susceptor elevator 268 lowers the susceptor 217 so that the support pins 266 protrude from the substrate placing surface 217d of the susceptor 217, and the wafer 200 loaded into the process chamber 201 is placed on the support pins 266. By placing the wafer 200 on the support pins 266, for example, the wafer 200 is heated to the first temperature of 300° C. or lower by the heater 217b embedded in the susceptor 217 and heated in advance.

While the temperature of the wafer 200 is being elevated, the vacuum pump 246 vacuum-exhausts the inner atmosphere of the process chamber 201 through the gas exhaust pipe 231 such that the inner pressure of the process chamber 201 reaches and is maintained at a predetermined pressure ranging from 0.5 Pa to 250 Pa, preferably from 10 Pa to 200 Pa. The vacuum pump 246 vacuum-exhausts the inner atmosphere of the process chamber 201 at least until a substrate unloading step described later is completed.

First Oxidizing Step

Subsequently, the first oxidizing step is performed by supplying the first oxygen-containing gas containing at least oxygen into the process chamber 201 and exciting the first oxygen-containing gas to generate the plasma. Similar to the first embodiment, the first oxide layer is formed by supplying the mixed gas of the $O_2$ gas and the $H_2$ gas into the process chamber 201 as the first oxygen-containing gas and modifying the surface of the wafer 200 at the first temperature by the plasma oxidation.

Second Temperature Elevating Step and Second Oxidizing Step

In a second temperature elevating step according to the second embodiment, as shown in FIG. 7, the wafer 200 is heated by the heater 217b embedded in the susceptor 217 and the lamp heater 280 by placing the wafer 200 on the susceptor 217 by elevating the susceptor 217 and operating the lamp heater 280. That is, by heating the wafer 200 using the lamp heater 280 in addition to the heater 217b, it is possible to more rapidly elevate the temperature of the wafer 200 to the second temperature higher than the first temperature. In a second oxidizing step according to the second embodiment, similar to the first embodiment, with the temperature of the wafer 200 elevated to the second temperature, the second oxide layer thicker than the first oxide layer is formed by supplying the mixed gas of the $O_2$ gas and the $H_2$ gas into the process chamber 201 as the second oxygen-containing gas and modifying the surface of the wafer 200 at the second temperature by the plasma oxidation.

The lamp heater 280 may also be used in the first oxidizing step of the second embodiment. That is, in the first oxidizing step of the second embodiment, the wafer 200 may be heated to the first temperature by irradiating the light from the lamp heater 280 at a first output, and in the second oxidizing step of the second embodiment, the wafer 200 may be heated to the second temperature higher than the first temperature by irradiating the light from the lamp heater 280 at a second output greater than the first output.

Alternatively, in the first oxidizing step of the second embodiment, the wafer 200 may be heated without irradiating the light from the lamp heater 280, and in the second oxidizing step of the second embodiment, the wafer 200 may be heated to the second temperature higher by irradiating the light from the lamp heater 280.

Third Embodiment

As described above, the first embodiment and the second embodiment are described by way of an example in which the surface of the wafer 200 is modified to form the oxide layer in the first oxidizing step and the second oxidizing step. However, in the method of manufacturing the semiconductor device according to the embodiments, since the desorption of the dopants is suppressed by the first oxide layer formed in the first oxidizing step, the oxidizing step is not limited to the two steps described above (that is, the first oxidizing step and the second oxidizing step). That is, the oxidizing step may include three or more steps. For example, after the second oxidizing step, the temperature of the wafer 200 may be further elevated to perform a third oxidizing step. That is, after the second oxidizing step, a third temperature elevating step of elevating the temperature of the wafer 200 to a third temperature higher than the second temperature and the third oxidizing step of forming a third oxide layer thicker than the second oxide layer by modifying the surface of the wafer 200, on which the second oxide layer is formed, with a plasma of a third oxygen-containing may be further performed.

Experimental Examples

Hereinafter, the technique of the present disclosure will be described in more detail with reference to experimental examples of the embodiments. For example, the materials, the contents of the processing and the procedures of the processing shown in the following experimental examples may be appropriately changed without departing from the gist of the technique. Therefore, the scope of the technique is not limited to the experimental examples below.

First Experimental Example: Comparison Between Thermal Oxidation and Plasma Oxidation Plasma Oxidation As the substrate to be processed, a silicon wafer (bare silicon wafer) with no film formed on a surface thereof is prepared. Using the substrate processing apparatus 100 shown in FIGS. 2 and 3, an oxide layer is formed on the bare silicon wafer by changing a temperature of the bare silicon wafer by the heater 217b embedded in the susceptor 217 and oxidizing a surface of the bare silicon wafer by the plasma oxidation. That is, after the substrate to be processed (that is, the bare silicon wafer) is loaded into the process chamber 201 by the transfer robot and placed on the susceptor 217, the mixed gas containing the $O_2$ gas and the $H_2$ gas (the amount of the $H_2$ gas introduced into the process chamber 201 is set to 100 sccm and the amount of the $O_2$ gas introduced into the process chamber 201 is set to 1,900 sccm) is introduced into the process chamber 201 and the inner pressure of the process chamber 201 is adjusted to 200 Pa by a pressure adjusting valve such as the exhaust valve (that is, the valve 243b) behind an exhaust port such as the gas exhaust port 235. By adjusting the temperature of the bare silicon wafer placed on the susceptor 217 by controlling the temperature of the susceptor 217 and applying the high frequency power of 27.12 MHz and 3.5 KW to a high frequency electrode such as the resonance coil 212 to generate the plasma in the process chamber 201, a silicon oxide film (SiO$_2$ film) serving as the oxide layer is formed on the bare silicon wafer by performing the plasma oxidation on the surface of the bare silicon wafer.

Thermal Oxidation

A bare silicon wafer is prepared similar to the plasma oxidation described above. An oxide layer is formed on the bare silicon wafer by changing the temperature of the bare silicon wafer and performing a thermal oxidation on a surface of the bare silicon wafer.

Figure 8:
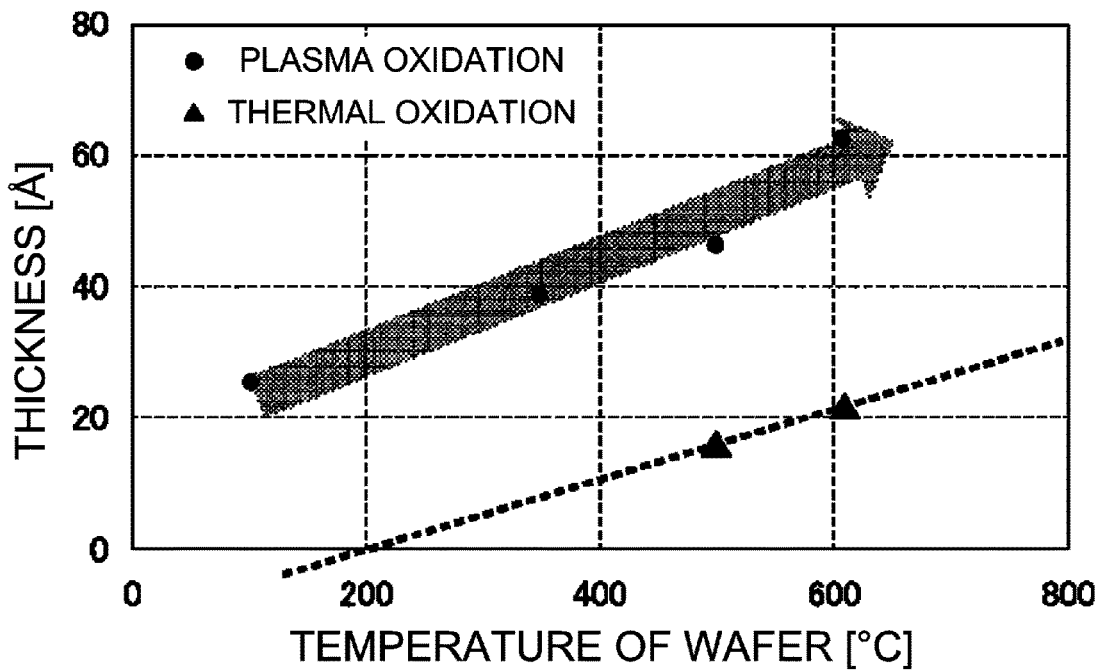
FIG. 8 schematically illustrates a relationship between a temperature of a wafer and a thickness of an oxide layer formed by a thermal oxidation of a bare silicon wafer or formed by a plasma oxidation of the bare silicon wafer.

FIG. 8 schematically illustrates a relationship between the temperature of the bare silicon wafer and a thickness of the oxide layer formed by performing the thermal oxidation of the surface of the bare silicon wafer and by performing the plasma oxidation on the surface of the bare silicon wafer. As shown in FIG. 8, even when the temperate of the bare silicon wafer is the same, it is confirmed that it is possible to form a thicker oxide layer by forming the oxide layer by the plasma oxidation than by forming the oxide layer by the thermal oxidation. For example, according to the thermal oxidation, the wafer (that is, the bare silicon wafer) is heated to about 600° C. in order to form the oxide layer of a thickness of about 20 Å (2 nm). On the other hand, according to the plasma oxidation, it is possible to form the oxide layer of a thickness of about 30 Å (3 nm) or more even when the temperature of the bare silicon wafer is relatively low, for example, 300° C. or less. Further, according to the plasma oxidation, at 600° C., it is possible to form the oxide layer of a thickness of 60 Å (6 nm) or more. Therefore, as described above, according to the plasma oxidation, it is possible to form the oxide layer at a relatively low temperature of 300° C. or less while suppressing the release and the diffusion of the dopants in the silicon film. The oxide layer formed at a relatively low temperature as described above serves as the cap layer of suppressing the release of the dopants from the silicon film. Therefore, by subsequently performing the plasma oxidation at a relatively high temperature exceeding 400° C., it is possible to increase the thickness of the oxide layer at a high oxidation rate while suppressing the release of the dopants from the silicon film.

Second Experimental Example

As the substrate to be processed, a silicon wafer including a poly-silicon film of a thickness of 1,200 μm doped with phosphorus (P) on a surface thereof is prepared. Hereinafter, the poly-silicon film may be simply referred to as a "silicon film". Using the substrate processing apparatus 101 shown in FIG. 7, the substrate to be processed (that is, the silicon wafer) is loaded into the process chamber 201 by the transfer robot, and is placed on the support pins 266 protruding from the substrate placing surface 217d of the susceptor 217. Thereafter, a temperature of the silicon wafer is adjusted to 300° C. by adjusting the separation distance between the silicon wafer placed on the support pins 266 and the susceptor 217 by controlling a height of the susceptor 217. After the temperature of the silicon wafer is adjusted, the mixed gas containing the O$_2$ gas and the H$_2$ gas (an amount of the H$_2$ gas introduced into the process chamber 201 is set to 100 sccm and an amount of the O$_2$ gas introduced into the process chamber 201 is set to 1,900 sccm) is introduced into the process chamber 201 and the inner pressure of the process chamber 201 is adjusted to 200 Pa by the pressure adjusting valve such as the exhaust valve (that is, the valve 243b) behind the exhaust port such as the gas exhaust port 235. As the first oxidizing step, by applying the high frequency power of 27.12 MHz and 0.5 KW to generate the plasma of the mixed gas in the process chamber 201, a silicon oxide film (SiO$_2$ film) of a thickness of about 2 nm serving as the first oxide layer is formed on a surface of the silicon film.

Subsequently, the substrate to be processed (that is, the silicon wafer) is placed on the susceptor 217 by elevating the susceptor 217 and the temperature of the silicon wafer is elevated to 600° C. by irradiating the light from the lamp heater 280. After the silicon wafer is heated to a desired temperature, as the second oxidizing step, the mixed gas of the same material composition as the first oxidizing step is introduced into the process chamber 201, and the inner pressure of the process chamber 201 is adjusted to 150 Pa by the pressure adjusting valve such as the exhaust valve (that is, the valve 243b) behind the exhaust port such as the gas exhaust port 235. Thereafter, by applying the high frequency power of 27.12 MHz and 3.5 KW to generate the plasma in the process chamber 201 and increasing the thickness of the SiO$_2$ film serving as the first oxide layer, a silicon oxide film (SiO$_2$ film) of a thickness of about 7 nm serving as the second oxide layer is formed. After the second oxide layer is formed, the silicon wafer is unloaded out of the process chamber 201.

Figure 9:
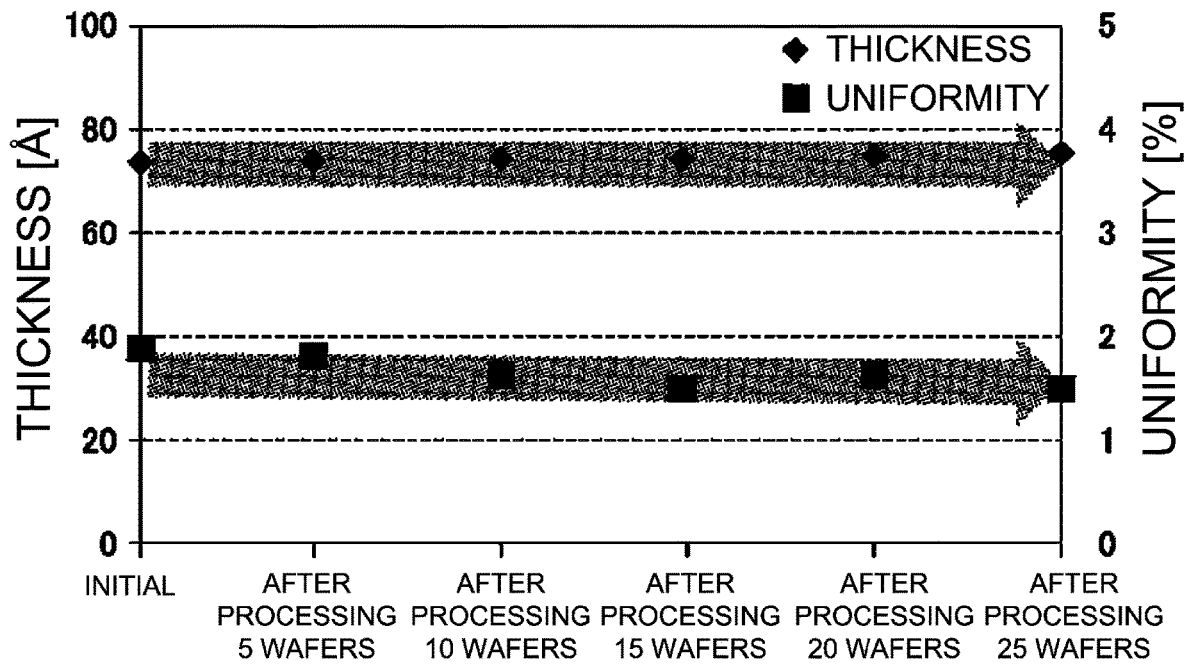
FIG. 9 schematically illustrates relationships among the number of processed wafers processed in an experimental example of the embodiments, a thickness of an oxide layer and a thickness uniformity of the oxide layer.

Using 25 wafers (that is, silicon wafers), a series of operations described above (that is, loading the wafer into the process chamber 201, forming the oxide layer (SiO$_2$ film) by the plasma oxidation using the first oxidizing step and the second oxidizing step and unloading the wafer out of the process chamber 201) is repeatedly preformed. For each wafer on which the oxide layer is formed, an average value of the thickness of the oxide layer and a thickness uniformity of the oxide layer on the surface of the wafer are measured for each of five wafers. The thickness of the oxide layer is measured at a plurality of measuring points (for example, 49 points) on the surface of the wafer using a spectroscopic ellipsometer, and the average value of the thickness of the oxide layer is obtained by averaging the measured values. The thickness uniformity of the oxide layer on the surface of the wafer is obtained based on a maximum value, a minimum value and the average value of the thickness of the oxide layer. That is, as an index of the uniformity, the thickness uniformity of the oxide layer on the surface of the wafer is obtained by: [(the maximum value−the minimum value)/2]/(the average value)×100. FIG. 9 schematically illustrates relationships among the number of the processed wafers processed in the second experimental example, the average value of the thickness of the oxide layer and the thickness uniformity of the oxide layer on the surface of the wafer. A vertical axis on a left side shown in FIG. 9 represents the average value of the thickness of the oxide layer, and a vertical axis on a right side shown in FIG. 9 represents the thickness uniformity (that is, a degree of variation) of the oxide layer on the surface of the wafer. As can be seen in FIG. 9, even when the plasma oxidation of the poly-silicon film doped with phosphorus (P) is repeatedly performed, there is almost no change in the thickness of the SiO$_2$ film (that is, the oxide layer) formed according to the plasma oxidation, which indicates that the apparatus such as the substrate processing apparatus described above can be operated stably.

By applying the method of manufacturing the semiconductor device according to the present embodiment to the substrate including the poly-silicon film doped with phosphorus (P), it is possible to process the substrate without being affected by the contamination by the dopants in the poly-silicon film doped with phosphorus. Therefore, it is expected to improve the reliability and the yield of the apparatus such as the substrate processing apparatus described above. Further, without dividing an oxidation process of the poly-silicon film doped with phosphorus into two steps (for example, a thermal oxidizing step and a plasma oxidizing step), it is possible to perform the oxidation process using the same recipe in the same process chamber while maintaining a stable oxidation rate, and it is also possible to perform the oxidation process avoiding the decrease in the throughput as compared with a case where the oxidation process is divided into the two steps.

Other Embodiments

While the technique of the present disclosure is mainly described using the embodiments and the modified examples, the above-described technique is not limited thereto. For example, the embodiments and the modified examples are described by way of an example in which the substrate including the film doped with the impurities on the surface thereof is used and the film is oxidized by the plasma oxidation. However, the substrate to be processed is not limited thereto. For example, with respect to a substrate including a film (for example, a silicon oxynitride film (SiOCN film)) containing an element such as carbon (C) which is easily desorbed from the film by the oxidation process, the oxide layer may be formed on the substrate including the film such as the SiOCN film using the oxidation process by modifying the surface of the substrate using the first oxidizing step and the second oxidizing step according to the embodiments. By performing the oxidation process according to the embodiments described above on such a substrate, it is possible to form the oxide layer on the surface of the film such as the SiOCN film while suppressing the desorption of a desired element such as carbon from the film. That is, it is possible to obtain the same effects according to the embodiment described above.

Further, each substrate processing apparatus shown in FIGS. 2, 3 and 7 is configured such that the support pins can be projected from the substrate placing surface of the susceptor by elevating or lowering the susceptor. However, the above-described technique is not limited thereto. For example, the support pins can be projected from the substrate placing surface of the susceptor by elevating or lowering the support pin. Further, while the substrate processing apparatus shown in FIG. 7 is provided with the susceptor and the lamp heater, which serve as a heating apparatus, the above-described technique is not limited thereto. The method of manufacturing the semiconductor device according to the embodiments may be performed by using a substrate processing apparatus provided with the lamp hear alone as the heating apparatus.

As described above, according to some embodiments in the present disclosure, it is possible to form the oxide layer while suppressing the decrease in the productivity and suppressing the unintended change in the surface characteristics of the substrate.

What is claimed is:
1. A method of manufacturing a semiconductor device, comprising:
  (a) forming a first oxide layer by modifying a surface of a substrate at a first temperature with a plasma of a first oxygen-containing gas; and
  (b) forming a second oxide layer thicker than the first oxide layer by heating the substrate to a second temperature higher than the first temperature and modifying the surface of the substrate, on which the first oxide layer is formed, with a plasma of a second oxygen-containing gas.

2. The method of claim 1, wherein the substrate comprises a film doped with impurities, and the surface of the substrate comprises a surface of the film.

3. The method of claim 2, wherein a thickness of the first oxide layer is 1.6 nm or more.

4. The method of claim 2, wherein a thickness of the first oxide layer is 2.0 nm or more.

5. The method of claim 2, wherein the second temperature is lower than 800° C.

6. The method of claim 2, wherein each of the first oxide layer and the second oxide layer comprises an oxide layer containing silicon.

7. The method of claim 1, wherein a material composition of the first oxygen-containing gas is same as a material composition of the second oxygen-containing gas.

8. The method of claim 1, wherein (a) and (b) are performed in a same process chamber.

9. The method of claim 8, wherein, in (a), the first oxide layer is formed while the substrate is supported by a support configured to support the substrate above a substrate mounting table such that the substrate is separated from a substrate placing surface of the substrate mounting table in which a heater is embedded.

10. The method of claim 9, wherein the substrate is placed on the support when the substrate is loaded into the process chamber.

11. The method of claim 9, wherein (a) is performed while a temperature of the substrate is being elevated.

12. The method of claim 9, wherein the second oxide layer is formed in (b) while the substrate is placed on the substrate placing surface of the substrate mounting table.

13. The method of claim 12, wherein the substrate is heated by a lamp in (b).

14. The method of claim 1, further comprising
  (c) forming a third oxide layer thicker than the second oxide layer by heating the substrate to a third temperature higher than the second temperature and modifying the surface of the substrate, on which the second oxide layer is formed, with a plasma of a third oxygen-containing gas.

15. A substrate processing apparatus comprising:
  a process chamber in which a substrate is processed;
  a gas supplier configured to supply an oxygen-containing gas into the process chamber;
  a heater capable of heating the substrate arranged in the process chamber;
  a plasma generator configured to excite the oxygen-containing gas supplied into the process chamber to generate a plasma; and
  a controller capable of controlling the gas supplier, the heater and the plasma generator to perform:
    (a) forming a first oxide layer by modifying a surface of the substrate in the process chamber at a first temperature with a plasma of a first oxygen-containing gas; and
    (b) forming a second oxide layer thicker than the first oxide layer by heating the substrate to a second temperature higher than the first temperature and modifying the surface of the substrate, on which the first oxide layer is formed, with a plasma of a second oxygen-containing gas.

16. The substrate processing apparatus of claim 15, wherein the substrate comprises a film doped with impurities, and the surface of the substrate comprises a surface of the film.

17. The substrate processing apparatus of claim 16, wherein a thickness of the first oxide layer is 1.6 nm or more.

18. A non-transitory computer-readable recording medium storing a program that causes, by a computer, a substrate processing apparatus to perform:
 (a) forming a first oxide layer by modifying a surface of a substrate at a first temperature with a plasma of a first oxygen-containing gas; and
 (b) forming a second oxide layer thicker than the first oxide layer by heating the substrate to a second temperature higher than the first temperature and modifying the surface of the substrate, on which the first oxide layer is formed, with a plasma of a second oxygen-containing gas.

19. The non-transitory computer-readable recording medium of claim 18, wherein the substrate comprises a film doped with impurities, and the surface of the substrate comprises a surface of the film.

20. The non-transitory computer-readable recording medium of claim 19, wherein a thickness of the first oxide layer is 1.6 nm or more.

\* \* \* \* \*